United States Patent
Toge

(10) Patent No.: US 10,031,670 B2
(45) Date of Patent: Jul. 24, 2018

(54) CONTROL UNIT AND CONTROL METHOD FOR CONTROLLING WRITES AND BACKGROUND OPERATIONS OF MULTIPLE SEMICONDUCTOR STORAGE DEVICES

(71) Applicant: TOSHIBA MEMORY CORPORATION, Minato-ku (JP)

(72) Inventor: Akihiro Toge, Yokohama (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 206 days.

(21) Appl. No.: 15/040,431

(22) Filed: Feb. 10, 2016

(65) Prior Publication Data

US 2017/0068456 A1    Mar. 9, 2017

Related U.S. Application Data

(60) Provisional application No. 62/214,473, filed on Sep. 4, 2015.

(51) Int. Cl.
*G06F 12/00* (2006.01)
*G06F 13/00* (2006.01)
(Continued)

(52) U.S. Cl.
CPC ............ *G06F 3/0605* (2013.01); *G06F 3/064* (2013.01); *G06F 3/0611* (2013.01); *G06F 3/0656* (2013.01); *G06F 3/0659* (2013.01); *G06F 3/0679* (2013.01); *G06F 11/1068* (2013.01); *G06F 12/0253* (2013.01); *G11C 16/10* (2013.01); *G11C 16/26* (2013.01); *G06F 12/0261* (2013.01); *G06F 12/0269* (2013.01); *G06F 12/0276* (2013.01); *G11C 29/52* (2013.01)

(58) Field of Classification Search
CPC .... G06F 3/0605; G06F 3/0659; G06F 3/0656; G06F 3/064; G06F 3/0679; G06F 3/0611; G06F 12/0253; G06F 12/0261; G06F 12/0269; G06F 12/0276; G06F 11/1068; G11C 16/26; G11C 16/10; G11C 29/52
USPC ........... 711/103, E12.009, E12.011, E12.012
See application file for complete search history.

(56) References Cited

U.S. PATENT DOCUMENTS 8,713,268 B2    4/2014  Dillow et al.
8,880,832 B2    11/2014 Namba et al.
(Continued)

FOREIGN PATENT DOCUMENTS

JP    2014-59850    4/2014
JP    5514169       6/2014

*Primary Examiner* — Tuan Thai
*Assistant Examiner* — Shane Woolwine
(74) *Attorney, Agent, or Firm* — Oblon, McClelland, Maier & Neustadt, L.L.P.

(57) ABSTRACT

According to one embodiment, a control unit writes data in a write buffer to a first semiconductor storage device, and requests the first semiconductor storage device to start a background operation. The control unit writes the data to a second semiconductor storage device, and requests the second semiconductor storage device to start a background operation. When the first semiconductor device is in a busy state because of the write operation or the background operation, the control unit reads data from either the second semiconductor storage device or the write buffer.

13 Claims, 25 Drawing Sheets

(51) Int. Cl.
*G06F 13/28* (2006.01)
*G06F 3/06* (2006.01)
*G11C 16/10* (2006.01)
*G11C 16/26* (2006.01)
*G06F 11/10* (2006.01)
*G06F 12/02* (2006.01)
*G11C 29/52* (2006.01)

(56) References Cited

U.S. PATENT DOCUMENTS

| | | | |
|---|---|---|---|
| 2011/0035548 A1* | 2/2011 | Kimmel | G06F 3/061 |
| | | | 711/114 |
| 2012/0036309 A1* | 2/2012 | Dillow | G06F 11/108 |
| | | | 711/103 |
| 2012/0151124 A1* | 6/2012 | Baek | G06F 12/0246 |
| | | | 711/103 |
| 2013/0046942 A1* | 2/2013 | Namba | G06F 3/0611 |
| | | | 711/156 |
| 2014/0082276 A1 | 3/2014 | Suzuki et al. | |

* cited by examiner

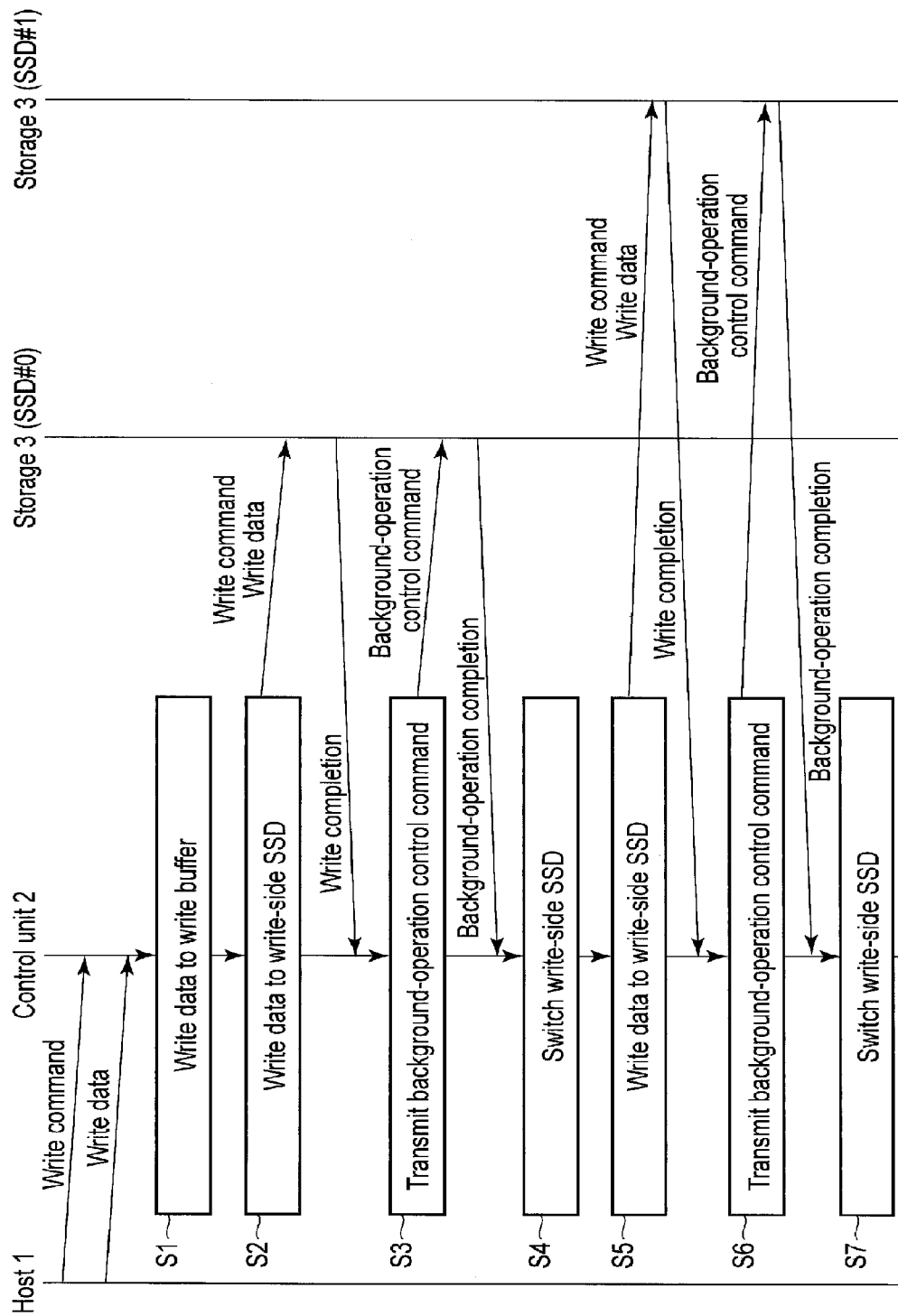
F I G. 2

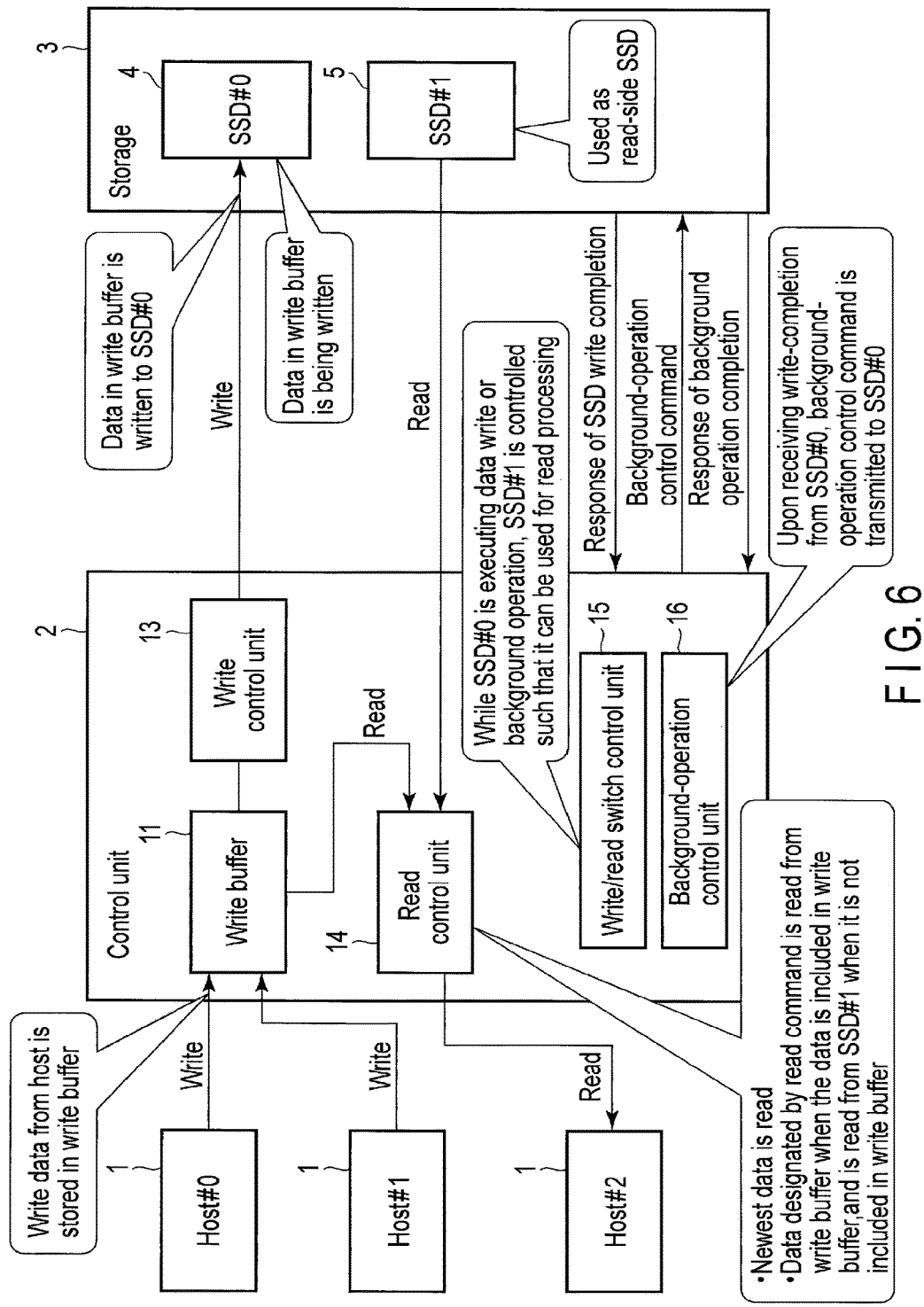
F I G. 6

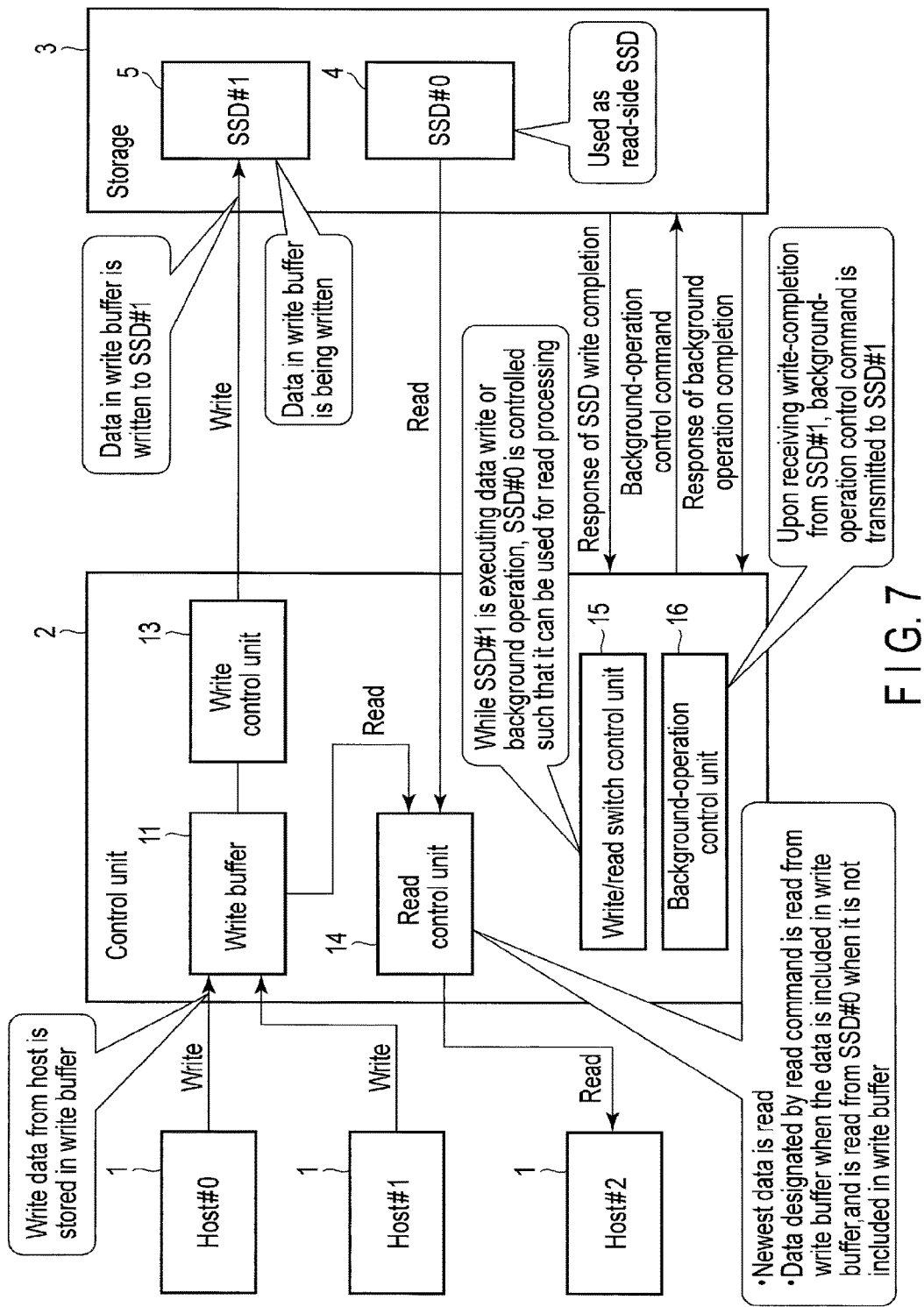
F I G. 7

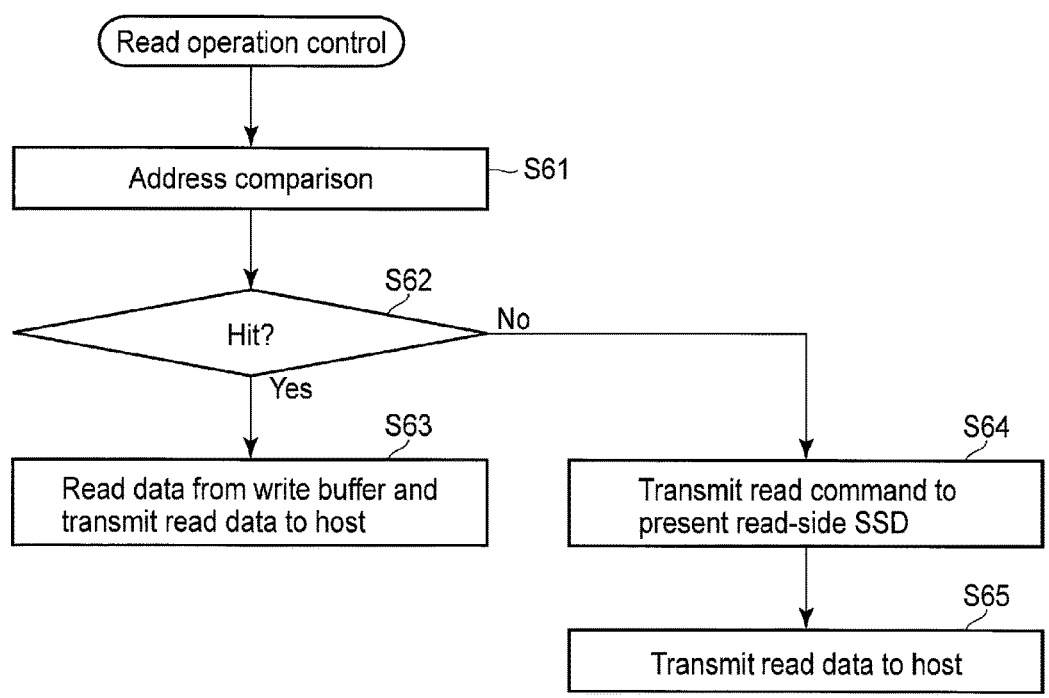
F I G. 9

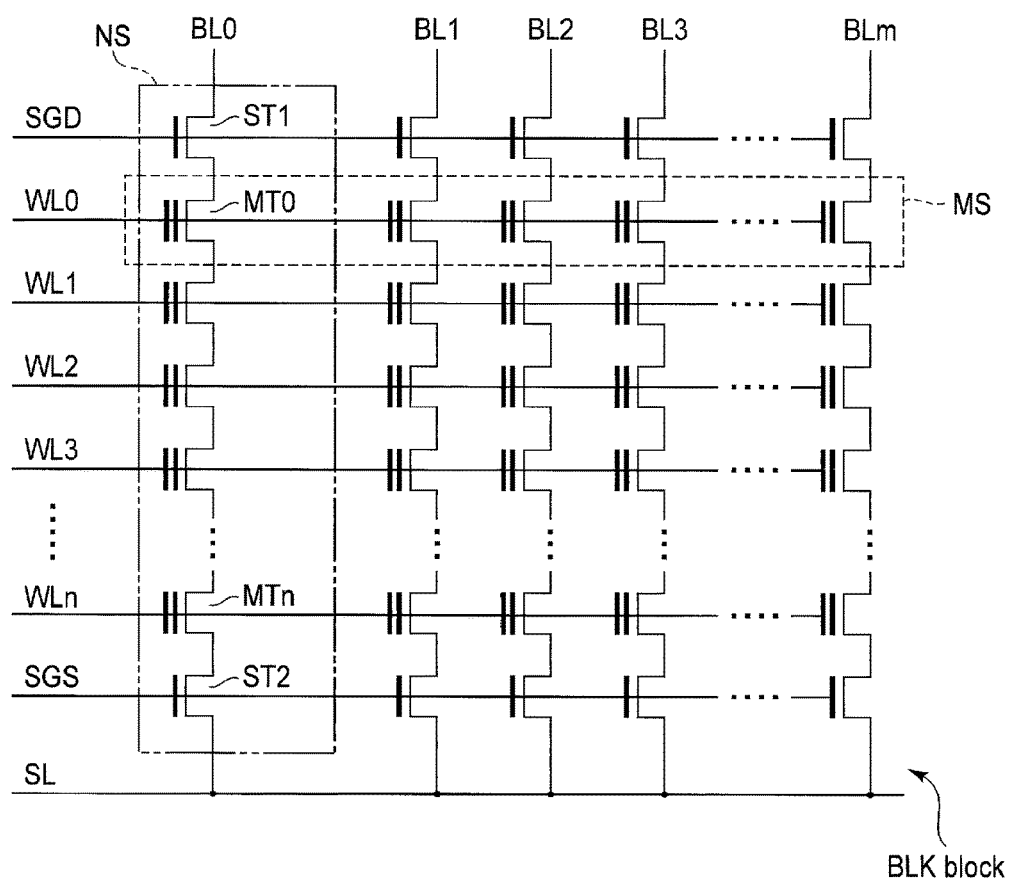
F I G. 12

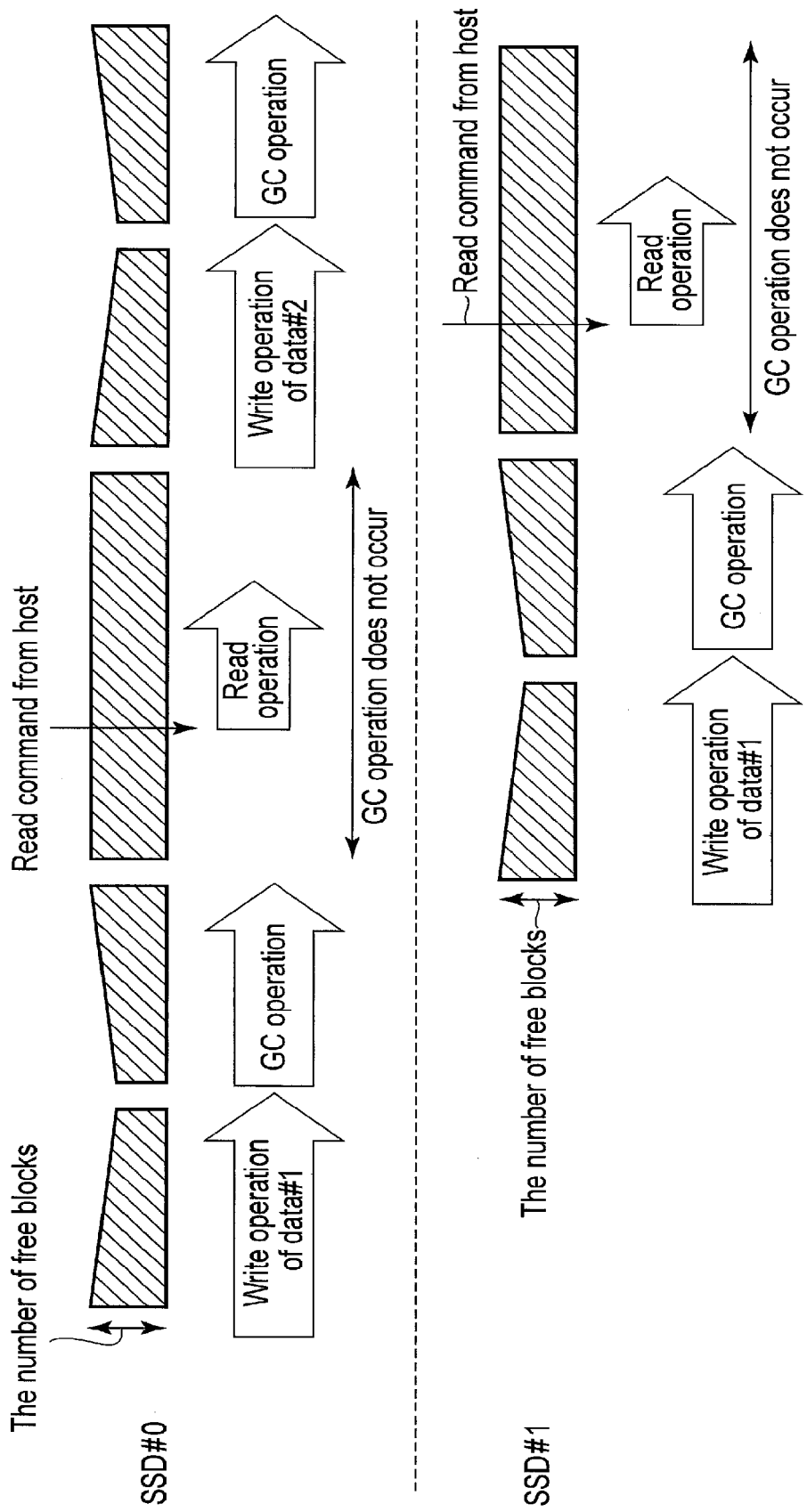
F I G. 14

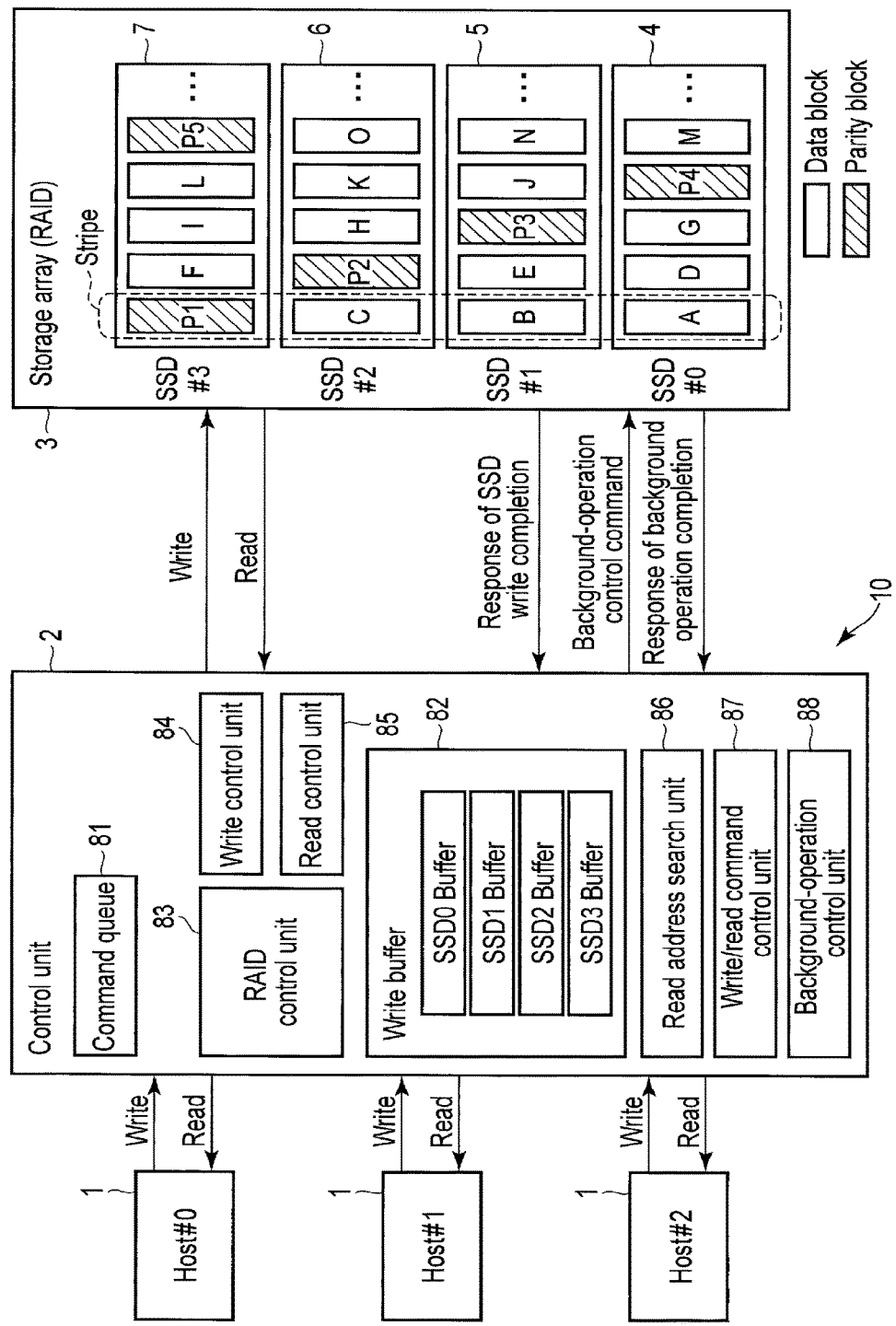
F I G. 15

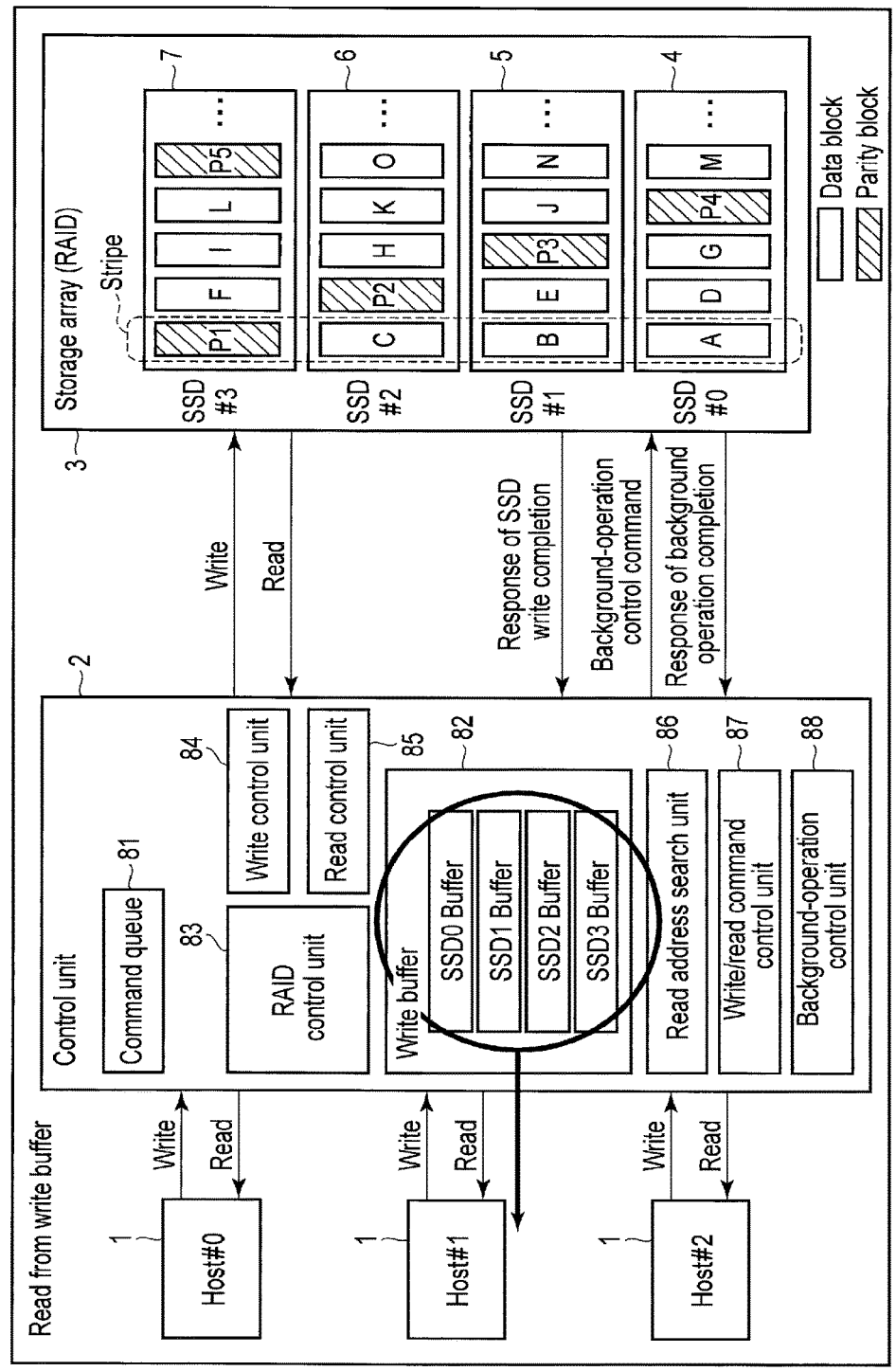
F I G. 16

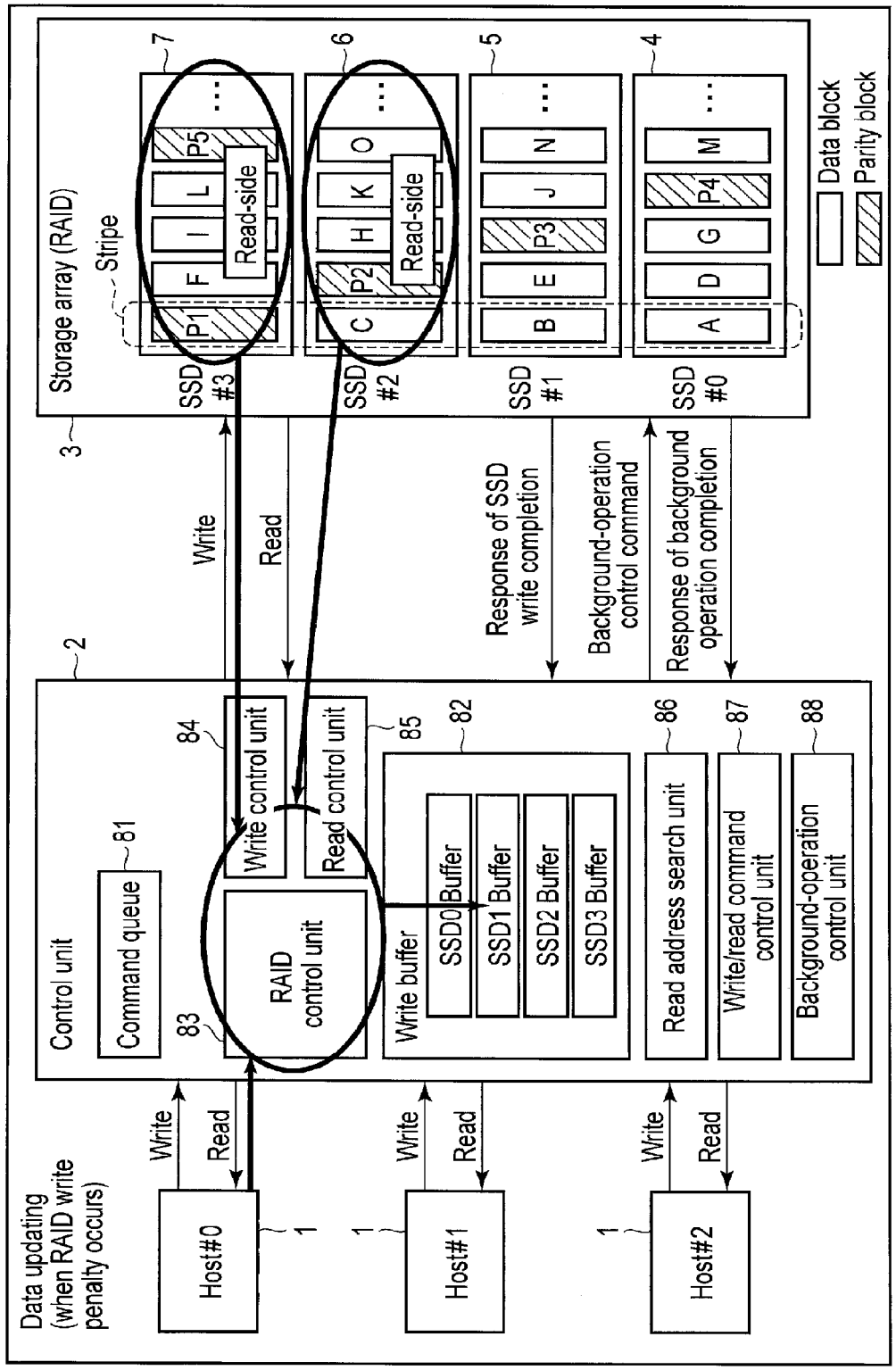
F I G. 20

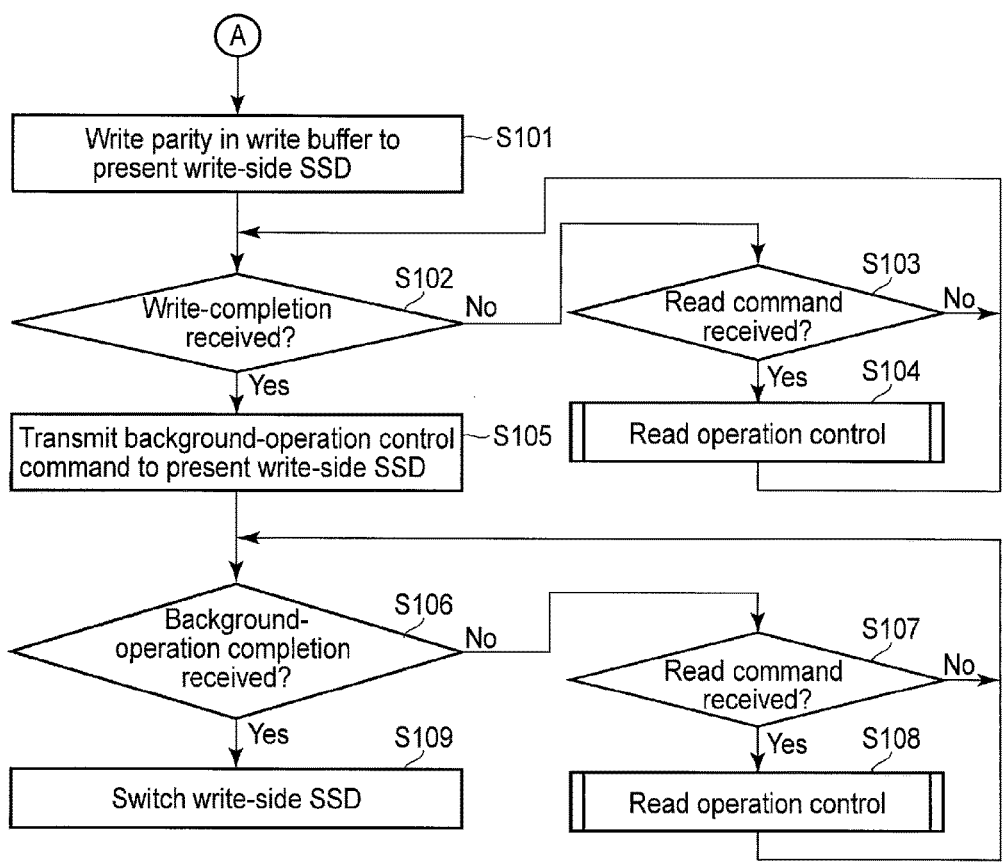
F I G. 23

… (1) …

CONTROL UNIT AND CONTROL METHOD FOR CONTROLLING WRITES AND BACKGROUND OPERATIONS OF MULTIPLE SEMICONDUCTOR STORAGE DEVICES

CROSS-REFERENCE TO RELATED APPLICATIONS

This application claims the benefit of U.S. Provisional Application No. 62/214,473, filed Sep. 4, 2015, the entire contents of which are incorporated herein by reference.

FIELD

Embodiments described herein relate generally to a control unit connectable to a semiconductor storage device.

BACKGROUND

In recent years, storage devices with nonvolatile memories have become widespread.

As one such storage device, a solid-state drive (SSD) provided with a NAND flash memory is known. SSDs are used as main storage for various information processing apparatuses.

A storage device such as an SSD performs background operations for securing usable physical resources. An example of the background operations includes a garbage collection operation.

However, the background operations may serve as bottlenecks and may adversely affect responses to commands from a host. There is a demand for a new function for stabilizing responses to commands from a host.

BRIEF DESCRIPTION OF THE DRAWINGS

FIG. 2 is a view illustrating a sequence of processing for write control and background control executed by the control unit of the embodiment.

FIG. 6 is a view for explaining control operations executed by the control unit of the embodiment when a first semiconductor storage device is a write-side storage device.

FIG. 7 is a view for explaining control operations executed by the control unit of the embodiment when a second semiconductor storage device is a write-side storage device.

FIG. 9 is a flowchart illustrating a procedure of read-operation control processing executed by the control unit of the embodiment.

FIG. 12 is a view illustrating a structure example of a memory cell array of a nonvolatile memory provided in each semiconductor storage device of FIG. 11.

FIG. 14 is a view illustrating a change in the number of free blocks in each of two semiconductor storage devices.

FIG. 15 is a block diagram illustrating another structure of the information processing system including the control unit of the embodiment.

FIG. 16 is a view for explaining processing of reading data from a write buffer in the control unit of the embodiment.

FIG. 20 is a view for explaining data update processing executed by the control unit of the embodiment.

FIG. 23 is a flowchart illustrating the remaining part of the procedure of the series of processing executed by the control unit of the embodiment.

DETAILED DESCRIPTION

With reference to the accompanying drawings, embodiments will be described.

In general, according to one embodiment, a control unit is connectable to a first semiconductor storage device and a second semiconductor storage device which include respective nonvolatile memories. The control unit includes a write buffer configured to temporarily store data to be written, which is received from a host, and a controller. The controller writes the data to the first semiconductor storage device, and requests the first semiconductor storage device to start a background operation after receiving a response indicating write completion from the first semiconductor storage device.

The controller writes the data to the second semiconductor storage device after the first semiconductor storage device completes the background operation, and requests the second semiconductor storage device to start a background operation, after receiving a response indicating write completion from the second semiconductor storage device.

The controller reads, from either the second semiconductor storage device or the write buffer, data designated by a read command received from the host, when the first semiconductor device is in a busy state because of the write operation or the background operation.

The controller reads, from either the first semiconductor storage device or the write buffer, data designated by the read command, when the second semiconductor device is in a busy state because of the write operation or the background operation.

[First Embodiment]

Figure 1:
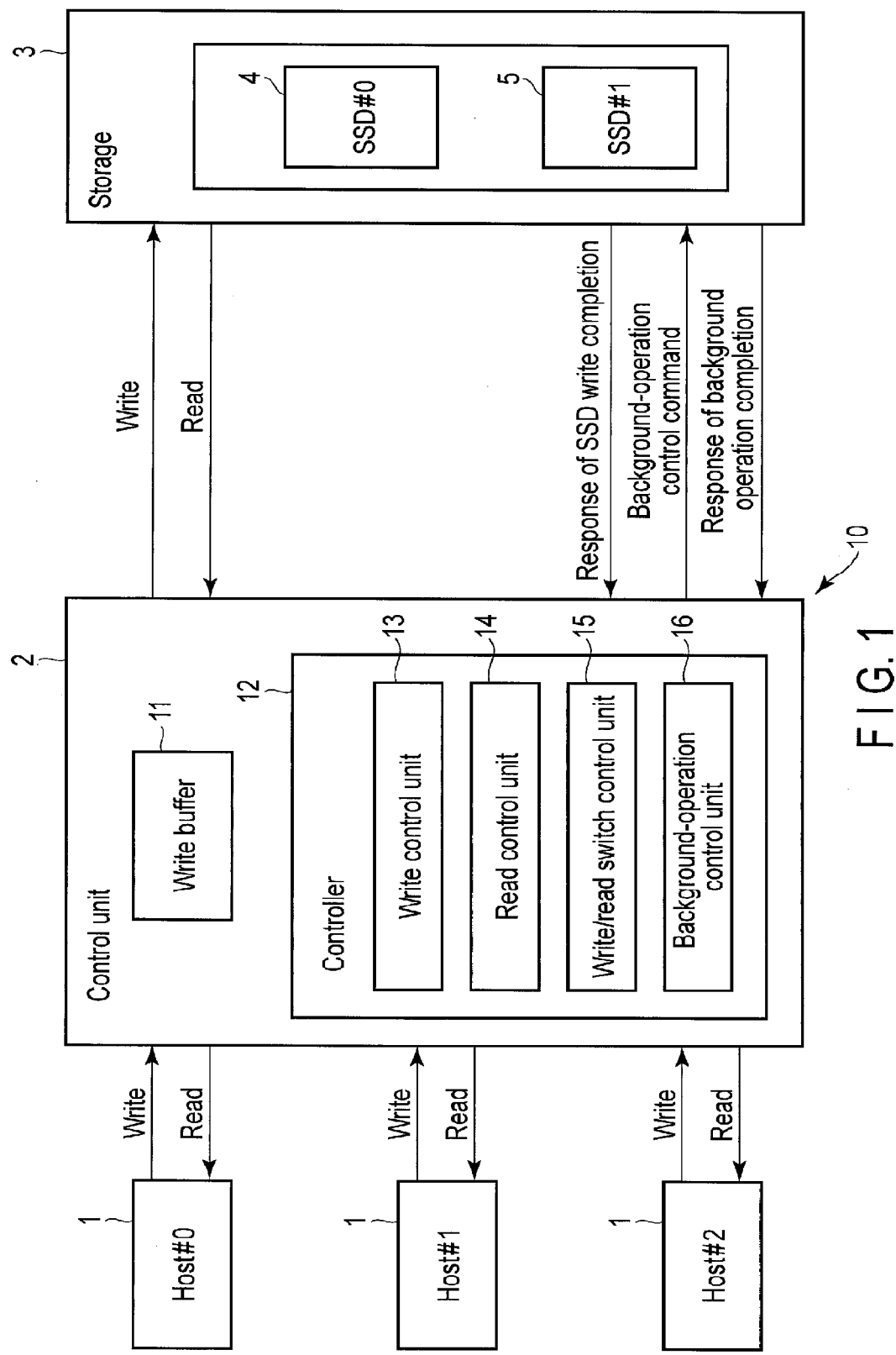
FIG. 1 is a block diagram illustrating a configuration of an information processing system including a control unit according to an embodiment.

Referring first to FIG. 1, the configuration of an information processing system 10 including a control unit 2 according to an embodiment will be described. The information processing system 10 comprises at least one host (host device) 1, a control unit 2 and a storage unit 3. The host 1 is an information processing apparatus, such as a server or a personal computer.

The control unit 2 writes data to the storage unit 3 and reads data from the storage unit 3, based on a write command and a read command from the host 1, respectively. The control unit 2 may be accommodated within the host 1 (information processing apparatus), or may be connected to the host 1 (information processing apparatus) through a cable or a network. If the information processing system 10 comprises a plurality of hosts 1 (host #0, host #1, host #2), the control unit 2 may be connected to these hosts 1 via a network, such as a LAN.

The storage unit 3 is a semiconductor storage device. In the embodiment, the storage unit 3 comprises at least a set of storage devices in order to stabilize the latency of reading. The set of storage devices include two semiconductor storage devices subjected to mirroring control by the control unit 2. The control unit 2 functions as a type of storage array controller, and controls the two semiconductor storage devices.

Each semiconductor storage device in the storage unit 3 may be realized as a solid-state drive (SSD) based on a NAND flash technique.

In this case, the storage unit 3 may comprise a set of SSDs, namely, two SSDs: SSD 4 (SSD#0) and SSD 5 (SSD#1). SSD 4 (SSD#0) and SSD 5 (SSD#1) may have the same capacity. The same logical address space (LBA space) may be assigned to SSD 4 (SSD#0) and SSD 5 (SSD#1). The control unit 2 may inform the host 1 of the capacity of one SSD as the total capacity of the storage unit 3.

As an interface for interconnecting the control unit 2 and the storage unit 3, SCSI, Serial Attached SCSI (SAS), ATA, Serial ATA (SATA), PCI Express (PCIe), etc., can be used.

Both the control unit 2 and the storage unit 3 may be accommodated within the host 1 (information processing apparatus), or the storage unit 3 may be connected to the information processing apparatus including the control unit 2 through a cable or network.

Alternatively, the storage unit 3 may be realized as a network storage device, such as network-attached storage (NAS). In this case, both the control unit 2 and the storage unit 3 may be accommodated within the housing of the network storage device.

Also in each of the above-mentioned configurations associated with the information processing system 10 comprising the host 1, the control unit 2, and the storage unit 3, the control unit 2 is positioned between the host 1 and the storage unit 3. Therefore, the control unit 2 appears to be a host from SSD 4 (SSD#0) and SSD 5 (SSD#1).

The control unit 2 comprises a write buffer 11 configured to temporarily store data to be written, which is received from the host 1, and a controller (control circuit) 12 configured to control the write buffer 11 and two SSDs 4 and 5 (SSD#0, SSD#1).

The write buffer 11 may store not only write data but also an address (logical block address: LBA) corresponding to the write data.

The control unit 2 alternately writes, to SSD 4 (SSD#0) and SSD 5 (SSD#1), write data (data to be written) received from the host 1. Thus, the same data is stored in both the two SSDs. Further, the control unit 2 sets one of these SSDs as a write-side storage device (write-enabled storage device), and sets the other SSD as a read-side storage device (read-enabled storage device).

The write-side storage device means a SSD on which a write operation and a background operation are permitted to be executed. Similarly, the read-side storage device means a SSD on which the write operation and the background operation are inhibited to be executed, that is, a SSD in a standby state which can be immediately responsive to the read command. The write-side storage device will be hereinafter referred to as a write-side SSD, and the read-side storage device will be hereinafter referred to as a read-side SSD.

Upon receiving a write command and write data from the host 1, the control unit 2 performs the following processing.

The control unit 2 stores in the write buffer 11 the write data (data to be written) received from the host 1. The write data stored in the write buffer 11 is maintained in the write buffer 11 until the write data is written to SSD 4 (SSD#0) and SSD 5 (SSD#1).

The control unit 2 writes, to a current write-side SSD (e.g., SSD#0), the write data stored in the write buffer 11. After receiving, from the write-side SSD, a response indicating completion of the write, the control unit 2 requests the write-side SSD to start a background operation, thereby causing the write-side SSD to execute the background operation.

The background operation means an internal operation for preparing usable physical resources.

As an example of the background operation, this operation may include a data copy operation, a block erasure operation, etc. An exemplary example of the background operation is a garbage collection operation for creating a usable free block.

The garbage collection operation creates a new usable free block from some blocks in which the valid data and invalid data are mixed. In the garbage collection operation, all valid data in the target blocks of the garbage collection targets are copied to another block (free block). Each block which includes only the invalid data as the valid data has been copied to another block is released as a free block.

In the embodiment, the write-side SSD executes a background operation, such as the garbage collection operation, requested by the control unit 2, immediately after a write operation. The background operation is a host-initiated background operation started by a request from the control unit 2. The number of free blocks in the write-side SSD can be increased by this background operation. Therefore, SSD#0 can be prevented from suddenly starting a background operation (a device-initiated background operation) when the control unit 2 has not determined to do so.

After completing the background operation of the write-side SSD, the control unit 2 changes the write-side SSD from SSD#0 to SSD#1, and changes the read-side SSD from SSD#1 to SSD#0.

In order to write, to SSD#1, the same data as that written to SSD#0, i.e., in order to cause SSD#1 to function as a mirror of SSD#0, the control unit 2 writes, to the write-side SSD (SSD#1), the write data being stored in the write buffer 11. After receiving a response indicating completion of the write from the write-side SSD (SSD#1), the control unit 2 requests the write-side SSD (SSD#1) to start a background operation, thereby causing the write-side SSD (SSD#1) to execute the background operation.

The number of free blocks in the write-side SSD (SSD#1) can be increased by this background operation. Therefore, SSD#1 can be prevented from suddenly starting a background operation (a device-initiated background operation) when the control unit 2 has not determined to do so.

After completing the background operation of the write-side SSD (SSD#1), the control unit 2 may change the write-side SSD from SSD#1 to SSD#0, and may change the read-side SSD from SSD#0 to SSD#1.

In summary, in the embodiment, the control unit 2 performs the following processing whenever receiving a write command from the host 1:

(1) Write the data of the write buffer 11 to SSD#0.
(2) Request SSD#0 to start a background operation.
(3) Write the data of the write buffer 11 to SSD#1 after SSD#0 completes the background operation.
(4) Request SSD#1 to start a background operation.

Since the data of the write buffer 11 is written to SSD#1 after SSD#0 completes the background operation, a period where SSD#0 is in a busy state because of a write operation or a background operation does not overlap a period where SSD#1 is in a busy state because of a write operation or a background operation.

Therefore, during a period in which one of SSD#0 and SSD#1 is in a busy state because of a write operation or a background operation, the other of SSD#0 and SSD#1 is maintained in a standby state where it can respond to a read command.

The busy state means a state where an operation (a write operation or a background operation) is currently executed. During a period in which the SSD is in the busy state, it cannot promptly respond to a command from the host 1.

If a read command is received from the host 1 while SSD#0 is in a busy state because of a write operation or background operation, the control unit 2 reads, from SSD#1 or the write buffer 11, data designated by the read command from the host 1.

Similarly, if a read command is received from the host 1 while SSD#1 is in a busy state because of a write operation or background operation, the control unit 2 reads, from SSD#0 or the write buffer 11, data designated by the read command from the host 1.

Moreover, when a read command is received from the host 1, if neither SSD#0 nor SSD#1 is in a busy state due to a write operation or background operation, the control unit 2 may read, from SSD#0 or SSD#1, data designated by the read command.

In this case, the control unit 2 may change the read target SSD between SSD#0 and SSD#1 whenever it receives a read command, in order to adjust, to the same degree, the waste of SSD#0 and SSD#1 due to increases in the number of read operations.

In the read-side SSDs, in a period immediately before this SSD is set as a new read-side SSD, a background operation (host-initiated background operation) is already executed, as is described above. Accordingly, the number of free blocks in this SSD is already increased. This means that start of a background operation by this SSD (device-initiated background operation) can be suppressed during a period in which this SSD is the read-side SSD.

This enables data designated by a read command to be immediately read by the read-side SSD, thereby stabilizing read latency.

The configuration of the controller 12 will now be described.

The controller 12 comprises a write control unit 13, a read control unit 14, a write/read switching control unit 15 and a background-operation control unit 16.

The write control unit 13 alternately writes write data, stored in the write buffer 11, to SSD 4 (SSD#0) and SSD 5 (SSD#1). More specifically, the write control unit 13 firstly transmits, to SSD 4 (SSD#0), a write command for requesting write of write data stored in the write buffer 11. After SSD 4 (SSD#0) completes a write operation and background operation, the write control unit 13 transmits, to SSD 5 (SSD#1), a write command for requesting write of the write data stored in the write buffer 11.

When the read control unit 14 receives a read command from the host 1, based on an address designated by the read command, the read control unit 14 reads, from the write buffer 11 or a SSD (SSD 4 or SSD 5), newest data designated by the read command. More specifically, upon receiving a read command from the host 1 while SSD 4 (SSD#0) is executing a write operation or background operation, the read control unit 14 reads data, designated by the read command, from the write buffer 11 or SSD 5 (SSD#1), and transmits the read data to the host 1. In contrast, upon receiving a read command from the host 1 while SSD 5 (SSD#1) is executing a write operation or background operation, the read control unit 14 reads data, designated by the read command, from the write buffer 11 or SSD 4 (SSD#0), and transmits the read data to the host 1.

The write/read switching control unit 15 sets one of SSD 4 (SSD#0) and SSD 5 (SSD#1) as a write-side SSD permitted to execute a write operation and a background operation, and sets the other of SSD 4 (SSD#0) and SSD 5 (SSD#1) as a read-side SSD inhibited from executing a write operation and a background operation.

Further, the write/read switching control unit 15 changes the write-side SSD from SSD 4 (SSD#0) to SSD 5 (SSD#1) upon receiving, from SSD 4 (SSD#0), a response indicating completion of the background operation. Furthermore, the write/read switching control unit 15 changes the write-side SSD from SSD 5 (SSD#1) to SSD 4 (SSD#0) upon receiving, from SSD 5 (SSD#1), a response indicating completion of the background operation.

The background-operation control unit 16 controls the background operations of SSD 4 (SSD#0) and SSD 5 (SSD#1). More specifically, upon receiving, from SSD 4 (SSD#0), a response indicating completion of writing, the background-operation control unit 16 transmits, to SSD 4 (SSD#0), a control command to start a background operation (i.e., a background operation control command). Similarly, upon receiving, from SSD 5 (SSD#1), a response indicating completion of writing, the background-operation control unit 16 transmits, to SSD 5 (SSD#1), a control command to start a background operation (i.e., a background operation control command).

FIG. 2 shows a sequence of processing for write control and background control, executed by the control unit 2.

When the control unit 2 receives a write command and write data from the host 1, the control unit 2 writes the write data to the write buffer 11 (step S1). The control unit 2 transmits, to write-side SSD 4 (SSD#0), a write command for requesting write of the write data stored in the write buffer 11 (step S2). SSD4 (SSD#0) performs a write operation, and transmits, to the control unit 2, a response indicating completion of writing (completion of the command). The response indicating completion of writing indicates completion of writing of the write data. For example, when the write operation for writing the write data to a nonvolatile memory in SSD 4 (SSD#0) is completed, SSD4 (SSD#0) transmits a response indicating completion of the writing. Alternatively, SSD4 (SSD#0) may transmit a response indicating completion of the writing when write data has been written to a write buffer in SSD 4 (SSD#0).

Upon receiving the response indicating write completion from SSD 4 (SSD#0), the control unit 2 transmits, to SSD 4 (SSD#0), a background operation control command for requesting start of a background operation (step S3). Upon receiving the background operation control command, SSD 4 (SSD#0) executes a background operation, such as a garbage collection (GC). After completion of the background operation, SSD 4 (SSD#0) transmits, to the control unit 2, a response indicating completion of the background operation.

For example, when the number of free blocks is increased to a threshold by the execution of the background operation, SSD 4 (SSD#0) may complete the background operation and transmit, to the control unit 2, a response indicating completion of the background operation. If the number of free blocks is already more than the threshold, SSD 4 (SSD#0) may immediately transmit, to the control unit 2, the response indicating completion of the background operation, without performing the background operation.

Upon receiving the response indicating completion of the background operation from SSD 4 (SSD#0), the control unit 2 changes the write-side SSD from SSD 4 (SSD#0) to SSD 5 (SSD#1), and changes the read-side SSD from SSD 5 (SSD#1) to SSD 4 (SSD#0) (step S4).

The control unit 2 transmits, to write-side SSD 5 (SSD#1), a write command to request writing of the write data of the write buffer 11 (step S5). SSD 5 (SSD#1) executes a write operation, and transmits, to the control unit 2, a response indicating completion of the write (command completion). For instance, SSD 5 (SSD#1) transmits the response indicating the write completion when a write operation for writing the write data to a nonvolatile memory in SSD 5 is completed. Alternatively, SSD 5 (SSD#1) may transmit the response indicating the write completion when write data is written to a write buffer in SSD 5 (SSD#1).

Upon receiving the response indicating the write completion from SSD 5 (SSD#1), the control unit 2 transmits, to SSD 5 (SSD#1), a background operation control command for requesting start of a background operation (step S6). Upon receiving the background operation control command, SSD 5 (SSD#1) executes a background operation, such as garbage collection (GC). After completing the background operation, SSD 5 (SSD#1) transmits, to the control unit 2, a response indicating completion of the background operation. When the number of free blocks is increased to the threshold, SSD 5 (SSD#1) may transmit, to the control unit 2, a response indicating completion of the background operation. If the number of free blocks is already more than the threshold, SSD 5 (SSD#1) may immediately transmit, to the control unit 2, the response indicating completion of the background operation, without performing the background operation.

Upon receiving the response indicating completion of the background operation from SSD 5 (SSD#1), the control unit 2 changes the write-side SSD from SSD 5 (SSD#1) to SSD 4 (SSD#0), and changes the read-side SSD from SSD 4 (SSD#0) to SSD 5 (SSD#1) (step S7).

Whenever the control unit 2 receives a write command from the host 1, it executes the above-mentioned steps S1 to S7.

Figure 3:
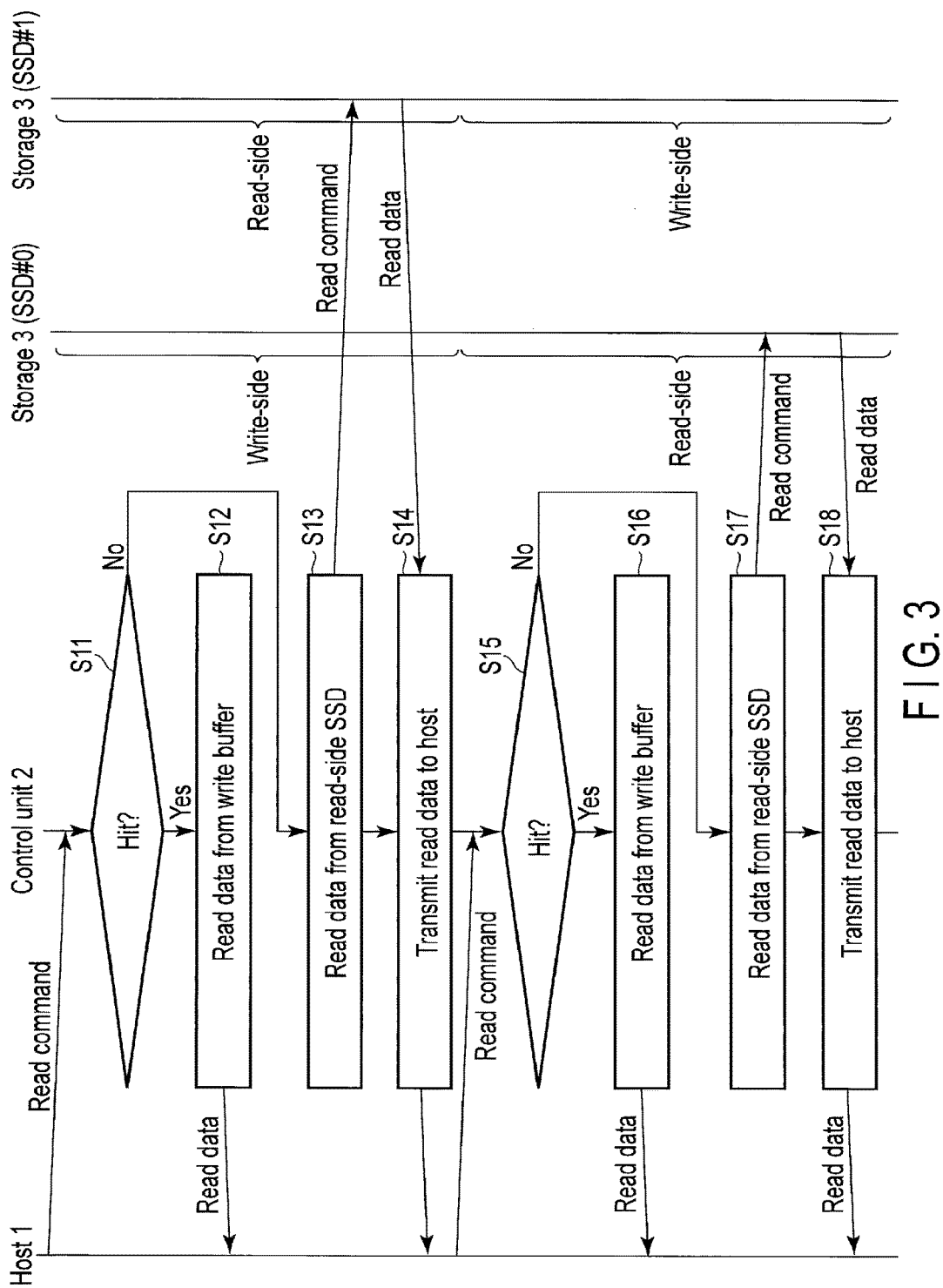
FIG. 3 is a view illustrating a sequence of processing for read control executed by the control unit of the embodiment.

FIG. 3 shows a sequence of processing for read control performed by the control unit 2.

Assume here a case where a read command is received from the host 1, with SSD 4 (SSD#0) set as the write-side SSD, and SSD 5 (SSD#1) set as the read-side SSD.

Upon receiving a read command from the host 1, the control unit 2 compares an address (LBA) designated by the read command with the address (LBA) of data stored in the write buffer 11, thereby determining whether the data designated by the read command resides in the write buffer 11 (step S11).

If the data designated by the read command resides in the write buffer 11 (i.e., if the write buffer is hit) (YES in step S11), the control unit 2 reads the data from the write buffer 11, and transmits it to the host 1 (step S12).

In contrast, if the data designated by the read command does not reside in the write buffer 11 (NO in step S11), the control unit 2 transmits, to read-side SSD 5 (SSD#1), a read command including the same address (LBA) as the address (LBA) included in the read command from the host 1, and reads data corresponding to this LBA from read-side SSD 5 (SSD#1) (step S13). The control unit 2 transmits the read data to the host (step S14).

Assume next a case where a read command is received from the host 1, with SSD 4 (SSD#0) set as the read-side SSD, and SSD 5 (SSD#1) set as the write-side SSD.

Upon receiving a read command from the host 1, the control unit 2 compares an address (LBA) designated by the read command with the address (LBA) of data stored in the write buffer 11, thereby determining whether the data designated by the read command resides in the write buffer 11 (step S15).

If the data designated by the read command resides in the write buffer 11 (i.e., if the write buffer is hit) (YES in step S15), the control unit 2 reads the data from the write buffer 11, and transmits it to the host 1 (step S16).

In contrast, if the data designated by the read command does not reside in the write buffer 11 (NO in step S15), the control unit 2 transmits, to read-side SSD 4 (SSD#0), a read command including the same address (LBA) as the address (LBA) included in the read command from the host 1, and reads data corresponding to this LBA from read-side SSD 4 (SSD#0) (step S17). The control unit 2 transmits the read data to the host 1 (step S18).

Figure 4:
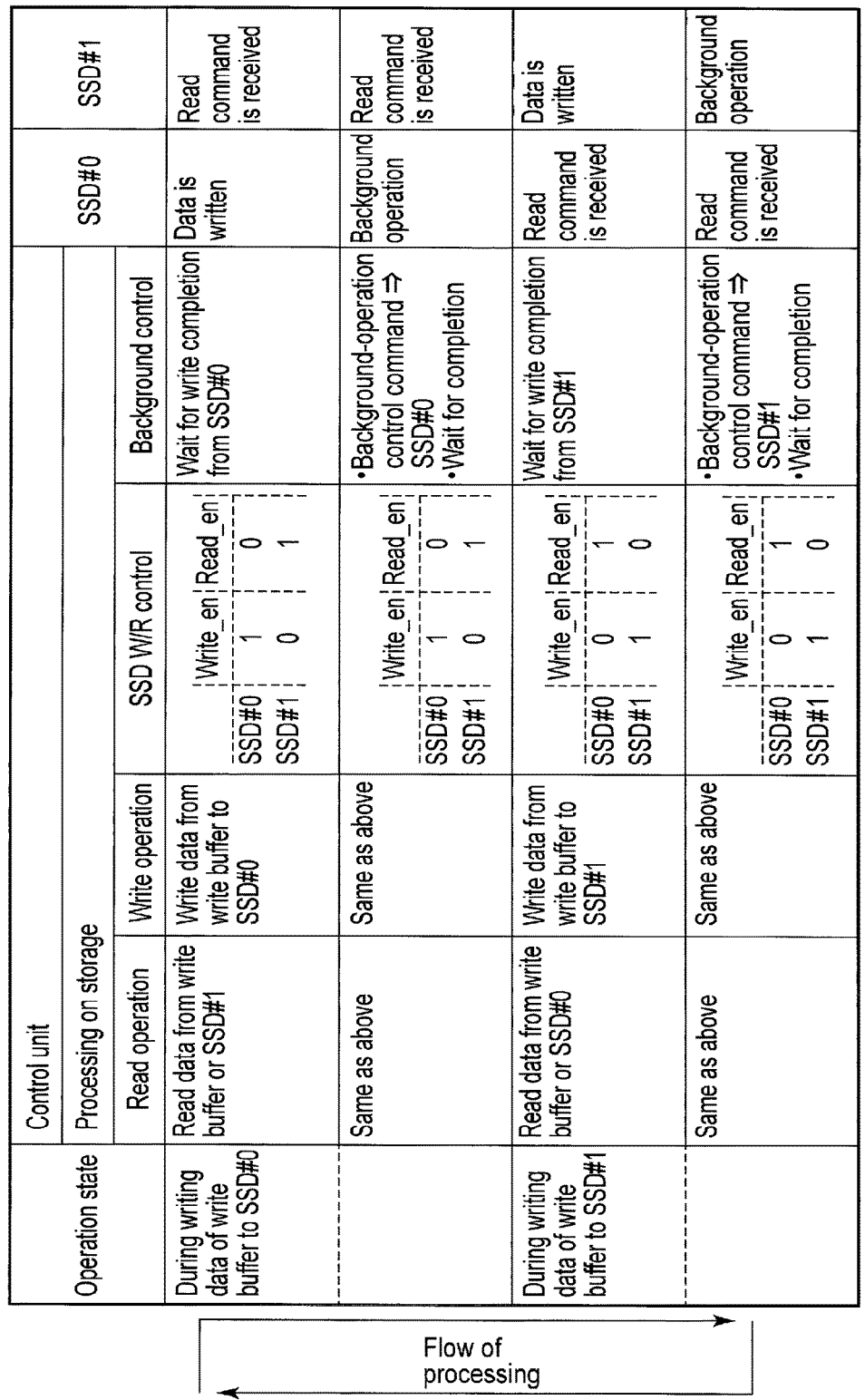
FIG. 4 is a view for explaining the outline of the operations executed by the control unit of the embodiment.

FIG. 4 shows the outline of the operation performed by the control unit 2.

The operation state managed by the control unit 2 is roughly divided into the following two states:

(1) A state where data in the write buffer 11 is being written to SSD#0

(2) A state where data in the write buffer 11 is being written to SSD#1

The operations of the control unit 2 are a read operation, a write operation, read/write control (SSD W/R control) and background control.

A description will now be given of "state where data in the write buffer 11 is being written to SSD#0".

<Read Operation>

When the control unit 2 has received a read command from the host 1 while writing data in the write buffer 11 to SSD#0, the control unit 2 reads data designated by the read command from the write buffer 11 if the designated data resides in the write buffer 11, and reads data from SSD#1 if the designated data does not reside in the write buffer 11.

<Write Operation>

The control unit 2 writes, to SSD#0, data stored in the write buffer 11.

<SSD W/R Control>

The control unit 2 sets one of SSD#0 and SSD#1 as the write-side SSD, and sets the other of SSD#0 and SSD#1 as the read-side SSD. In this case, SSD#0 is set as the write-side SSD, and SSD#1 is set as the read-side SSD.

<Background Control>

The control unit 2 waits for a response indicating write completion, issued from SSD#0.

SSD#0 and SSD#1 operate as follows:

SSD#0 performs a write operation for writing data stored in the write buffer 11. SSD#1 can receive (accept) a read command. That is, SSD#1 is in a standby state responsive to the read command.

When the control unit 2 has received the response indicating the write completion from SSD#0, the control unit 2 transmits a background operation control command to SSD#0. SSD#0 performs a background operation, based on the received background operation control command. After completing the background operation, SSD#0 transmits a response indicating completion of the background operation to the control unit 2. Upon receiving the response indicating completion of the background operation from SSD#0, the operating state of the control unit 2 shifts to "state where data in the write buffer 11 is being written to SSD#1".

A description will then be given of the "state where data in the write buffer 11 is being written to SSD#1".

<Read Operation>

When the control unit 2 has received a read command from the host 1 while writing data in the write buffer 11 to SSD#1, the control unit 2 reads data designated by the read command from the write buffer 11 if the designated data resides in the write buffer 11, and reads data from SSD#0 if the designated data does not reside in the write buffer 11.

<Write Operation>

The control unit 2 writes, to SSD#1, data stored in the write buffer 11.

<SSD W/R Control>

The control unit 2 sets one of SSD#0 and SSD#1 as the write-side SSD, and sets the other of SSD#0 and SSD#1 as the read-side SSD. In this case, SSD#1 is set as the write-side SSD, and SSD#0 is set as the read-side SSD.

<Background Control>

The control unit 2 waits for a response indicating write completion, issued from SSD#1.

SSD#0 and SSD#1 operate as follows:

SSD#1 performs a write operation for writing data stored in the write buffer 11. SSD#0 can receive (accept) a read command. That is, SSD#0 is in a standby state responsive to the read command.

When the control unit 2 has received the response indicating the write completion from SSD#1, the control unit 2 transmits a background operation control command to SSD#1. SSD#1 performs a background operation, based on the received background operation control command. After completing the background operation, SSD#1 transmits a response indicating completion of the background operation to the control unit 2.

Figure 5:
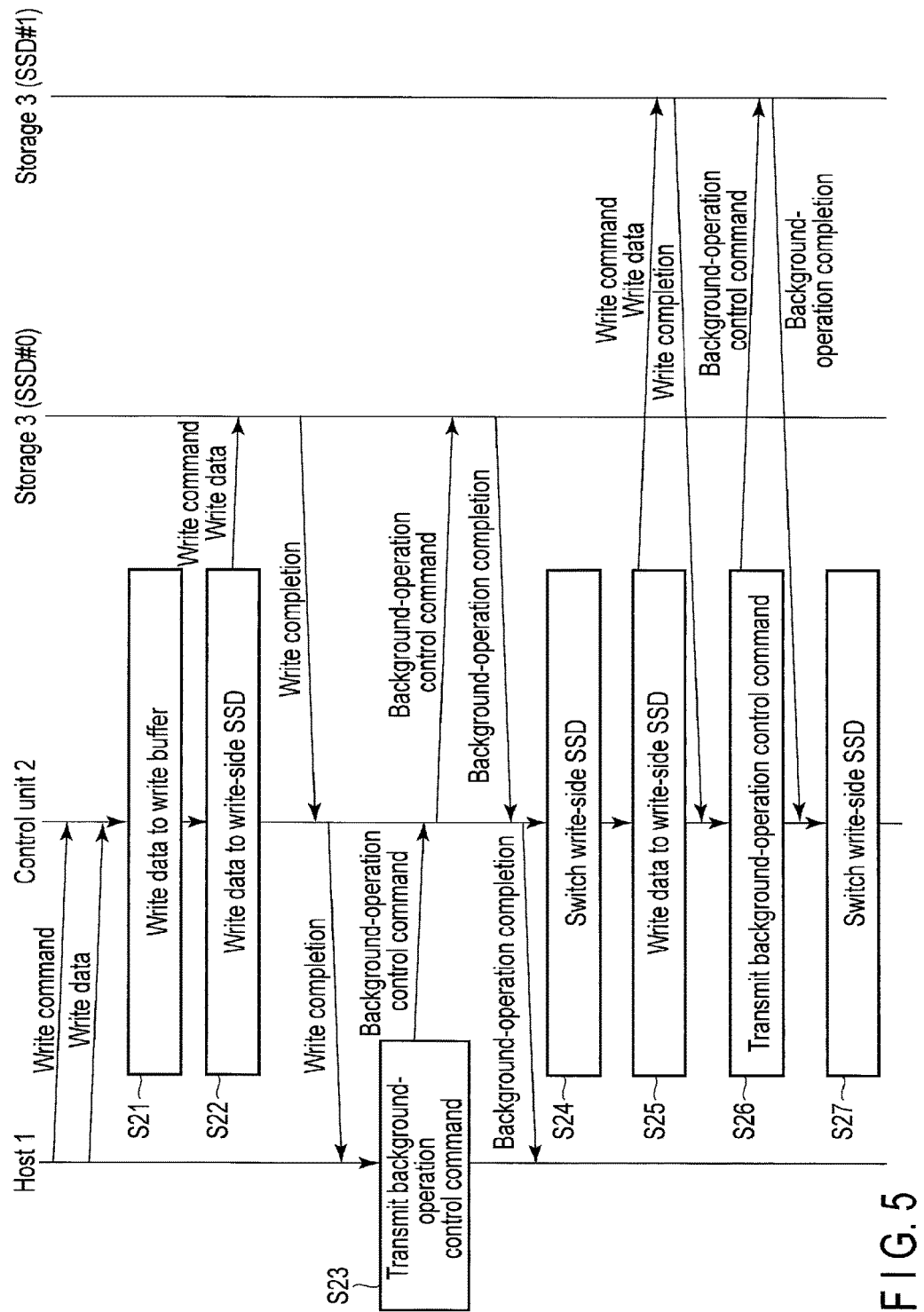
FIG. 5 is a view illustrating another sequence of processing for write control and background control executed by the control unit of the embodiment.

FIG. 5 shows another processing sequence for write control and background control performed by the control unit 2.

In the processing sequence described with reference to FIG. 2, when the control unit 2 has received a response indicating write completion from write-side SSD 4 (SSD#0), the control unit 2 transmits a background operation control command to write-side SSD 4 (SSD#0).

In contrast, in the processing sequence of FIG. 5, the control unit 2 transfers a response indicating write completion from write-side SSD 4 (SSD#0) to the host 1. After that, the control unit 2 waits for a background operation control command issued from the host 1. Upon receiving a background operation control command from the host 1, the control unit 2 transmits the received background operation control command to write-side SSD 4 (SSD#0).

Specifically, the following processing is performed.

Upon receiving a write command and write data from the host 1, the control unit 2 writes the write data to the write buffer 11 (step S21). The control unit 2 transmits, to write-side SSD4 (SSD#0), a write command for requesting write of the write data in the write buffer 11 (step S22). SSD 4 (SSD#0) performs a write operation, and transmits a response indicating the write completion (command completion) to the control unit 2.

Upon receiving the response indicating the write completion from SSD 4 (SSD#0), the control unit 2 transmits, to the host 1, the response indicating the write completion (command completion) of SSD 4 (SSD#0). Upon receiving the response indicating the write completion, the host 1 transmits, to the control unit 2, a background operation control command for requesting start of a background operation (step S23). Upon receiving the background operation control command from the host 1, the control unit 2 transmits, to SSD 4 (SSD#0), the background operation control command for requesting start of a background operation.

Upon receiving the background operation control command, SSD4 (SSD#0) performs the background operation (such as garbage collection [GC]). After completing the background operation, SSD 4 (SSD#0) transmits a response indicating completion of the background operation to the control unit 2. Upon receiving the response indicating completion of the background operation from SSD 4 (SSD#0), the control unit 2 transfers the response indicating completion of the background operation to the host 1.

Upon receiving the response indicating completion of the background operation from SSD 4 (SSD#0), the control unit 2 changes the write-side SSD from SSD 4 (SSD#0) to SSD 5 (SSD#1), and changes the read-side SSD from SSD 5 (SSD#1) to SSD 4 (SSD#0) (step S24).

The control unit 2 transmits, to write-side SSD 5 (SSD#1), a write command for requesting write of the write data in the write buffer 11 (step S25). SSD 5 (SSD#1) performs a write operation, and transmits a response indicating write completion (command completion) to the control unit 2.

Upon receiving the response indicating the write completion from SSD 5 (SSD#1), the control unit 2 transmits, to SSD 5 (SSD#1), a background operation control command for requesting start of a background operation (step S26). Upon receiving the background operation control command, SSD 5 (SSD#1) performs the background operation (such as garbage collection [GC]). After completing the background operation, SSD 5 (SSD#1) transmits a response indicating completion of the background operation to the control unit 2.

Upon receiving the response indicating completion of the background operation from SSD 5 (SSD#1), the control unit 2 changes the write-side SSD from SSD 5 (SSD#1) to SSD 4 (SSD#0), and changes the read-side SSD from SSD 4 (SSD#0) to SSD 5 (SSD#1) (step S27).

Whenever the control unit 2 has received a write command from the host 1, the control unit 2 performs processing sequences ranging from step S21 to step S27.

FIG. 6 shows control operations performed by the control unit 2 when SSD 4 (SSD#0) is the write-side SSD.

Upon receiving a write command and write data from the host 1, the control unit 2 stores the received write data in the write buffer 11. The write control unit 13 writes the write data stored in the write buffer 11 to SSD 4 (SSD#0) as the write-side SSD. When the writing of the write data is completed, SSD 4 (SSD#0) transmits a response indicating write completion to the control unit 2. Upon receiving the response indicating the write completion from SSD 4 (SSD#0), the background-operation control unit 16 of the control unit 2 transmits a background operation control command to SSD 4 (SSD#0), thereby requesting SSD 4 (SSD#0) to perform a background operation.

Upon receiving the background operation control command, SSD 4 (SSD#0) performs the background operation (such as garbage collection [GC]). When the background operation is completed, SSD 4 (SSD#0) transmits a response indicating completion of the background operation to the control unit 2.

The write/read switching control unit 15 of the control unit 2 keeps SSD 5 (SSD#1) as the read-side SSD until receiving the response indicating completion of the background operation from SSD4 (SSD#0). Therefore, the write/read switching control unit 15 enables data to be read from SSD 5 (SSD#1) while SSD 4 (SSD#0) is executing a write or background operation.

Upon receiving a response indicating completion of the background operation from SSD 4 (SSD#0), the write/read switching control unit 15 changes the write-side SSD from SSD 4 (SSD#0) to SSD 5 (SSD#1), and changes the read-side SSD from SSD 5 (SSD#1) to SSD 4 (SSD#0).

Upon receiving a read command from the host 1, the read control unit 14 of the control unit 2 confirms whether data designated by the read command resides in the write buffer 11. If the write data in the write buffer 11 is the data designated by the read command, the read control unit 14 reads the write data from the write buffer 11, and transmits it to the host 1. This is because in the embodiment, in order to write same data to SSD 4 (SSD#0) and SSD 5 (SSD#1), write data is maintained in the write buffer 11 until writing of the write data to SSD 5 (SSD#1) is completed. Therefore, newest data can be transmitted to the host 1 by reading write data from the write buffer 11.

FIG. 7 shows control operations performed by the control unit 2 when SSD 5 (SSD#1) is the write-side SSD.

Upon receiving a write command and write data from the host 1, the control unit 2 stores the received write data in the write buffer 11. The write control unit 13 writes the write data, stored in the write buffer 11, to SSD 5 (SSD#1) as the write-side SSD. When the writing of the write data is completed, SSD 5 (SSD#1) transmits a response indicating write completion to the control unit 2. Upon receiving the response indicating the write completion from SSD 5 (SSD#1), the background-operation control unit 16 of the control unit 2 transmits a background operation control command to SSD 5 (SSD#1), thereby requesting SSD5 (SSD#1) to execute a background operation.

Upon receiving the background operation control command, SSD 5 (SSD#1) performs the background operation (such as garbage collection [GC]). When the background operation is completed, SSD 5 (SSD#1) transmits a response indicating completion of the background operation to the control unit 2.

The write/read switching control unit 15 of the control unit 2 keeps SSD 4 (SSD#0) as the read-side SSD until receiving the response indicating completion of the background operation from SSD 5 (SSD#1). Therefore, the write/read switching control unit 15 enables data to be read from SSD 4 (SSD#0) while SSD 5 (SSD#1) is executing a write or background operation.

Upon receiving a response indicating completion of the background operation from SSD 5 (SSD#1), the write/read switching control unit 15 changes the write-side SSD from SSD 5 (SSD#1) to SSD 4 (SSD#0), and changes the read-side SSD from SSD 4 (SSD#0) to SSD 5 (SSD#1).

Upon receiving a read command from the host 1, the read control unit 14 of the control unit 2 confirms whether data designated by the read command resides in the write buffer 11. If the write data designated by the read command resides in the write buffer 11, the read control unit 14 reads the write data from the write buffer 11, and transmits it to the host 1.

Figure 8:
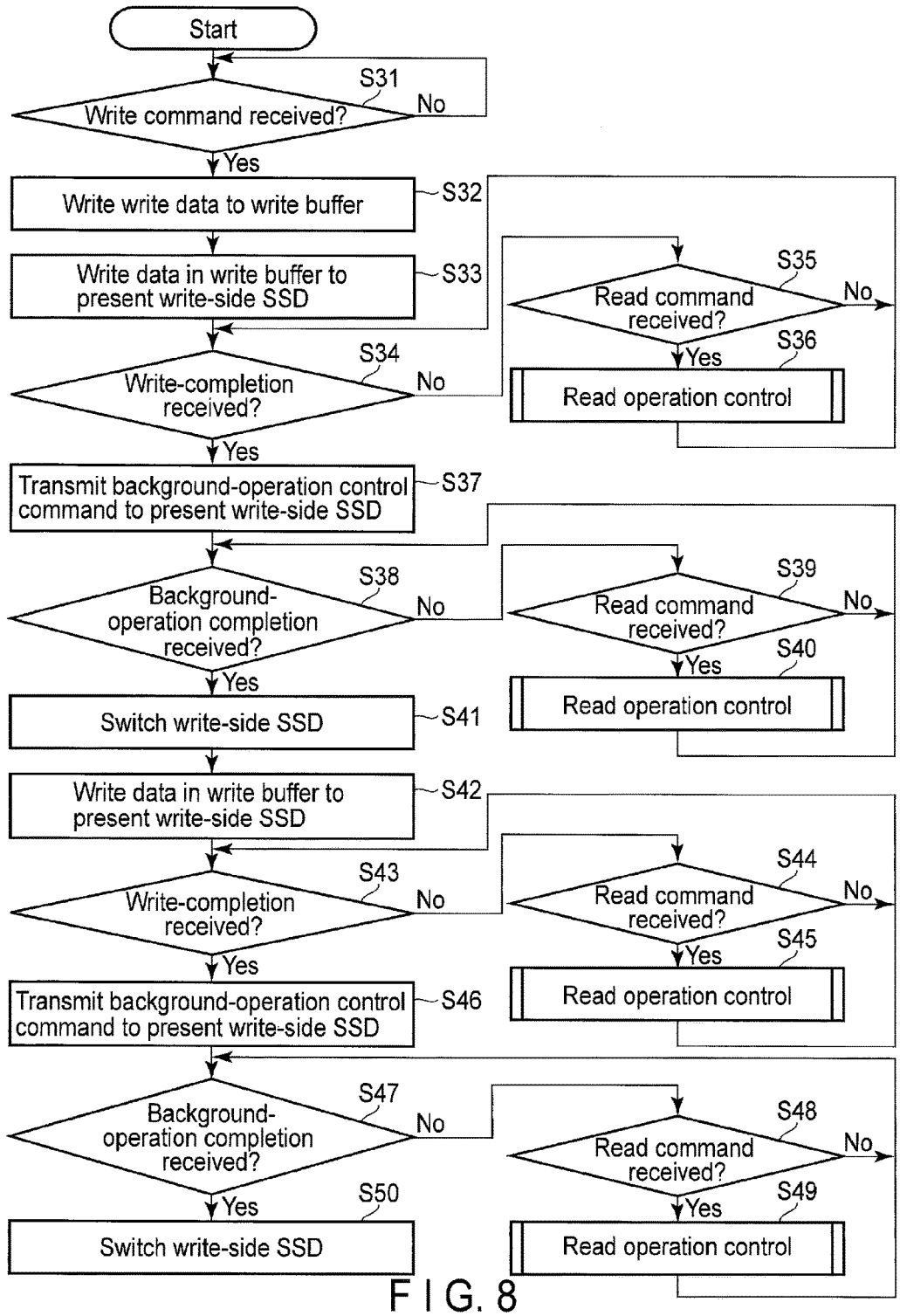
FIG. 8 is a flowchart illustrating a procedure of a series of processing executed by the control unit of the embodiment.

The flowchart of FIG. 8 shows a procedure of a series of processing performed by the control unit 2.

Upon receiving a write command from the host 1 (YES in step S31), the control unit 2 writes, to the write buffer 11, write data supplied from the host 1 (step S32). The control unit 2 transmits the write command for requesting write of the write data of the write buffer 11 to present write-side SSD 4 (SSD#0) (step S33). The control unit 2 waits for a response indicating write completion, issued from present write-side SSD 4 (SSD#0) (step S34). If a read command from the host 1 is received while waiting for the response indicating the write completion (YES in step S35), the control unit 2 performs read operation control, which will be described in detail with reference to FIG. 9 (step S36).

If a response indicating write completion is received from present write-side SSD 4 (SSD#0) (YES in step S34), the control unit 2 transmits, to present write-side SSD 4 (SSD#0), a background control command for requesting start of a background operation (step S37). The control unit 2 waits for a response indicating completion of the background operation, issued from present write-side SSD 4 (SSD#0) (step S38). If a read command from the host 1 is received while waiting for the response indicating the background operation completion (YES in step S39), the control unit 2 performs read operation control (step S40).

If a response indicating completion of the background operation is received from present write-side SSD 4 (SSD#0) (YES in step S38), the control unit 2 changes the write-side SSD to SSD 5 (SSD#1) (step S41).

The control unit 2 transmits a write command for requesting write of the above-mentioned write data of the write buffer 11 to present write-side SSD 5 (SSD#1) (step S42). The control unit 2 waits for a response indicating write completion, issued from present write-side SSD 5 (SSD#1) (step S43). If a read command from the host 1 is received while waiting for the response indicating the write completion (YES in step S44), the control unit 2 performs read operation control (step S45).

If a response indicating write completion is received from present write-side SSD 5 (SSD#1) (YES in step S43), the control unit 2 transmits, to present write-side SSD 5 (SSD#1), a background control command for requesting start of a background operation (step S46). The control unit 2 waits for a response indicating completion of the background operation, issued from present write-side SSD 5 (SSD#1) (step S47). If a read command from the host 1 is received while waiting for the response indicating the background operation completion (YES in step S48), the control unit 2 performs read operation control (step S49).

If a response indicating completion of the background operation is received from present write-side SSD 5 (SSD#1) (YES in step S47), the control unit 2 changes the write-side SSD to SSD 4 (SSD#0) (step S50).

The flowchart of FIG. 9 shows a procedure of read operation control performed by the control unit 2.

Upon receiving a read command from the host 1, the control unit 2 performs processing described below.

First, the control unit 2 compares an address designated by the read command with the address of the write data of the write buffer 11 (step S61), and determines whether newest data having the same address as that designated by the read command resides in the write buffer 11 (step S62).

If the write buffer 11 stores newest data having the same address as that designated by the read command (YES in step S62), the control unit 2 reads the data from the write buffer 11, and transmits it to the host 1 (step S63).

In contrast, if the write buffer 11 does not store newest data having the same address as that designated by the read command (NO in step S62), the control unit 2 transmits a read command to the present read-side SSD, thereby reading, from the read-side SSD, data having the address designated by the read command (step S64). The control unit 2 transmits the read data to the host 1 (step S65).

Figure 10:
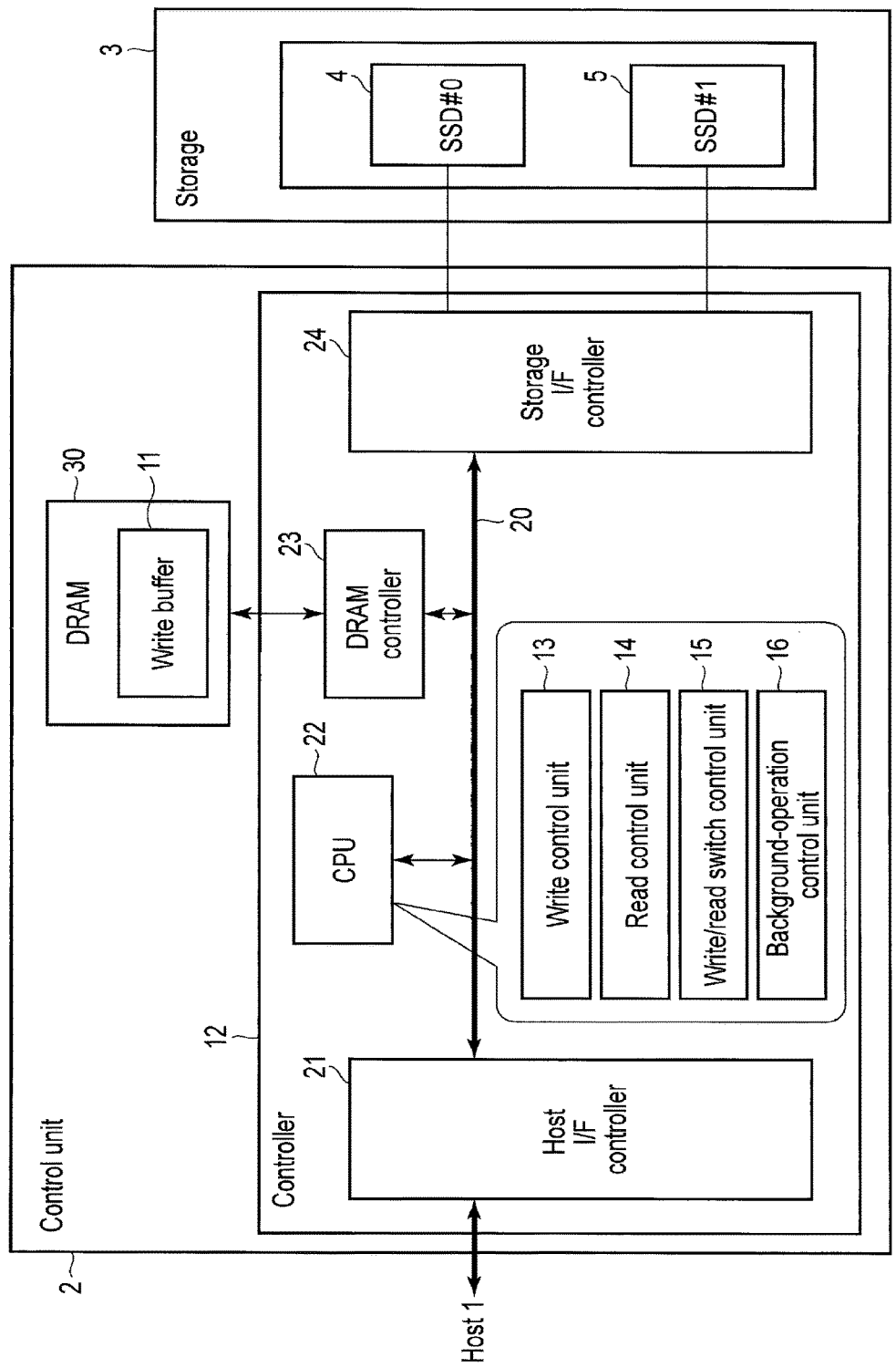
FIG. 10 is a block diagram illustrating a hardware configuration example of the control unit of the embodiment.

FIG. 10 shows a hardware configuration example of the control unit 2.

The control unit 2 may comprise the above-described controller 12, and a RAM, such as a DRAM 30. Part of the storage area of the DRAM 30 may be used as the above-described write buffer 11.

The controller 12 includes a host interface controller 21, a CPU 22, a DRAM controller 23, a storage interface controller 24, etc. The host interface controller 21, the CPU 22, the DRAM controller 23 and the storage interface controller 24 are interconnected via a bus 20.

The host interface controller 21 is configured to interface with the host 1. The host interface controller 21 receives, from the host 1, various commands, such as write commands and read commands.

The CPU 22 is a processor configured to control the host interface controller 21, the DRAM controller 23 and the storage interface controller 24. The CPU 22 further controls the write buffer 11, SSD 4 (SSD#0), and SSD 5 (SSD#1). Firmware executed by the CPU 22 causes the CPU 22 to function as above-described write control unit 13, read control unit 14, the write/read switching control unit 15 and background-operation control unit 16.

The storage interface controller 24 transmits a command, sent from the CPU 22, to either SSD 4 (SSD#0) or SSD 5 (SSD#1) under control of the CPU 22.

Figure 11:
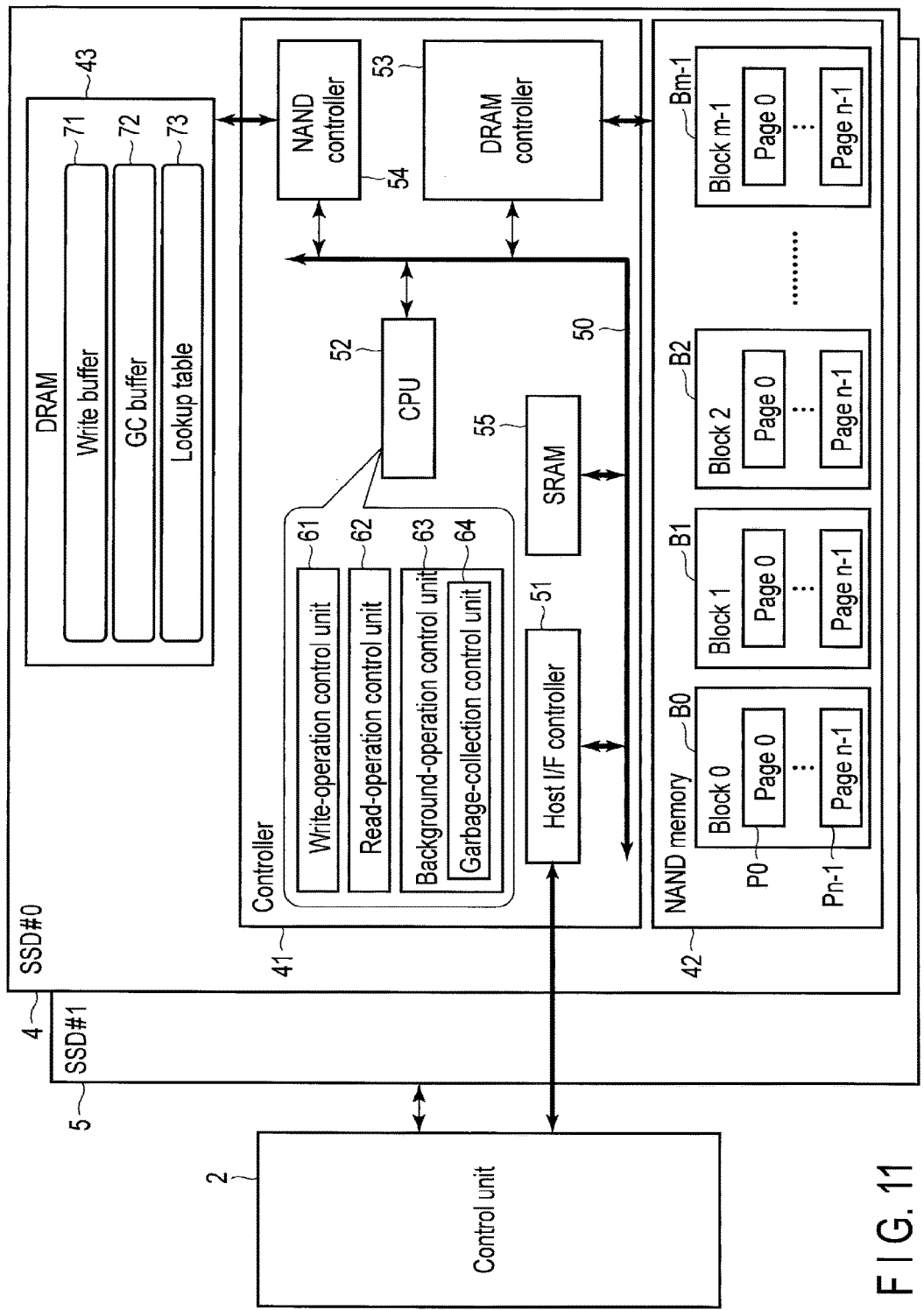
FIG. 11 is a block diagram illustrating a hardware configuration example of each semiconductor storage device controlled by the control unit of the embodiment.

FIG. 11 shows hardware configuration examples of each of SSD 4 and SSD 5.

Since SSD 4 and SSD 5 have the same hardware configuration, a description will hereinafter be given only of the configuration of SSD 4 (SSD#0).

SSD 4 (SSD#0) comprises a controller (device controller) 41, a nonvolatile memory (NAND memory) 42 and a DRAM 43. The NAND memory 42 may comprise a plurality of NAND flash memory chips, although it is not limited to this structure.

The NAND memory 42 includes a large number of NAND blocks (blocks) B0 to Bm−1. Block, B0 to Bm−1, functions as an erase unit. The block may be also called a physical block or an erase block.

The blocks B0 to Bm−1 each include a large number of pages (physical pages). That is, each of blocks B0 to Bm−1 includes pages P0 to Pn−1. In the NAND memory 42, read of data and write of data are executed in units of a page, and erase of data is executed in units of a block.

The NAND memory 42 comprises one or more memory chips each having a memory cell array. The memory cell array comprises a plurality of memory cells arranged in a matrix. The memory cell array comprises a plurality of blocks each formed of a plurality of physical sectors.

FIG. 12 shows a configuration example of one of blocks included in the memory cell array. The other blocks have the same configuration as this. As shown in FIG. 12, a block BLK of the memory cell array comprises (m+1) (m is an integer not less than 0) NAND strings NS. Each NAND string NS includes (n+1) (n is an integer not less than 0) memory cell transistors MT0 to MTn connected in series with the diffusion areas of each pair of adjacent memory cell transistors MT shared therebetween, and selective transistors ST1 and ST2 arranged at the opposite ends of each of (n+1) memory cell transistors MT0 to MTn.

Word lines WL0 to WLn are connected to the respective control gate electrodes of memory cell transistors MT0 to MTn of each NAND string NS, and memory cell transistors MTi (i=0 to n) in respective NAND strings NS are connected in common to the same word line WLi (i=0 to n). That is, the control gate electrodes of memory cell transistors MTi arranged in the same row in the block BLK are connected to the same word line WLi.

Memory cell transistors MT0 to MTn each comprise a field effect transistor having a laminated gate structure formed on a semiconductor substrate. The laminated gate structure comprises a charge accumulation layer (floating gate electrode) formed on the semiconductor substrate with a gate insulating film interposed therebetween, and a control gate electrode formed on the charge accumulation layer with an inter-gate insulating film interposed therebetween. Memory cell transistors MT0 to MTn have their threshold voltage varied in accordance with the number of electrons accumulated in the respective floating gate electrodes, and can store data in accordance with differences in threshold voltage.

Bit lines BL0 to BLm are connected to the respective drains of (m+1) selective transistors ST1 included in one block BLK, and a selective gate line SGD is connected in common to the gates of (m+1) selective transistors ST1. Further, the source of each select transistor ST1 is connected to the drain of memory cell transistor MT0. Similarly, a source line SL is connected in common to the sources of (m+1) selective transistors ST2 in one block BLK, a selective gate line SGS is connected in common to the gates of (m+1) selective transistors ST2. Furthermore, the drain of each select transistor ST2 is connected to the source of corresponding memory cell transistor MTn.

Each memory cell is connected to both a word line and a bit line. Each memory cell can be identified based on an address for identifying the word line and an address for identifying the bit line. As described above, data of a plurality of memory cells (memory cell transistors MT) in the same block BLK is erased simultaneously. In contrast, a data read and write are performed per page. If each memory cell can store only two values, one page corresponds to a one physical sector MS that includes a plurality of memory cells connected to one word line.

In the case in which each memory cell can store multi-values, if it is operated in a single-level-cell (SLC) model, one physical sector MS corresponds to one page. If each memory cell is operated in a multi-level-cell (MLC) mode, one physical sector MS corresponds to N pages (N is a natural number not less than 2). When N=2, one physical sector MS corresponds to 2 pages, and when N=3, one physical sector MS corresponds to 3 pages.

In a read operation and a programmed operation, one of the word lines is selected in accordance with a physical address, and one of the physical sectors MS is selected. Switching of pages in a physical sector MS is performed based on a physical address.

In FIG. 11, the controller 41 is electrically connected to the NAND memory 42 as a nonvolatile memory via a NAND controller 53, such as Toggle or ONFI. The controller 41 controls the NAND memory 42.

The controller 41 may function as a flash translation layer (FTL) configured to perform data management of the NAND memory 42 and block management of the NAND memory 42.

The data management includes, for example, (1) management of mapping data indicating the relationship between logical block addresses (LBAs) and physical block addresses, and (2) processing for hiding read/write operation performed per page, and erase operation performed per block. Mapping management between the LBAs and the physical addresses is performed using a look-up table (LUT) 73. A physical address corresponding to a certain LBA indicates a storage location in the NAND memory 42 to which data designated by the LBA is written. The physical address includes a physical page address and a physical block address. The physical page address is allocated to each of all pages, and the physical block address is allocated to each of all physical blocks.

Only one data write to a page is possible per one erase cycle.

Accordingly, the controller 41 maps write (overwrite) to the same LBA to another page of the NAND memory 42. That is, the controller 41 writes data to another page. After that, the controller 41 updates the look-up table (LUT) 73 to associate the LBA with said another page and invalidate original page (namely, old data previously associated with the LBA).

The block management includes management of a bad block, wear leveling, the background operation, etc. The wear leveling is an operation for leveling the number of program-erasing operations of each physical block.

The background operation is an internal operation for arranging data in each block and preparing usable physical resources. A typical example of the background operation is a garbage collection operation for moving valid data in some blocks in the NAND memory 42 to a free block. In the garbage collection operation, the look-up table (LUT) 73 is updated to thereby map the LBAs of copied valid data to correct physical addresses.

The control unit 2 transmits, to SSD 4 (SSD#0) or SSD 5 (SSD#1), a write command for requesting write of the write data designated by a write command received from the host 1. This write command includes a logical address (starting logical address) of the write data (namely, data which should be written), and a transfer length. Although the LBA is used as a logical address in this embodiment, an object ID may be used as the logical address in other embodiments. The LBA is expressed by a serial number assigned to a logical sector (size: 512 bytes, for example). The serial number begins with zero.

The controller 41 writes, to a physical page in a physical block in the NAND memory 42, write data designated by the starting logical address (starting LBA) and the transfer length in the write command. Furthermore, by updating the look-up table (LUT) 73, the controller 42 maps an LBA corresponding to the written data to a physical address corresponding to the physical storage location where the data has been written.

The configuration of the controller 42 will now be described.

The controller 42 comprises a host interface controller 51, a CPU 52, a NAND controller 53, a DRAM controller 54, an SRAM 55, etc. The host interface controller 51, CPU 52, NAND controller 53, DRAM controller 54, and SRAM 55 are connected to each other via a bus 50.

The host interface controller 51 receives various commands (a write command, a read command, a background operation control command, etc.) from the host 1 (control unit 2).

The write command requests SSD 4 (SSD#0) to write data designated by this write command. The write command includes an LBA of first data and a transfer length. The read command requests SSD 4 (SSD#0) to read data designated by this read command. The read command includes an LBA of first data and a transfer length.

The background operation control command is a control command that requests SSD 4 (SSD#0) to start a background operation (for example, a garbage collection operation). The background operation control command includes, for example, a host-initiated garbage collection control command which requests start of the garbage collection operation.

The CPU 52 is a processor configured to control the host interface controller 51, the NAND controller 53, the DRAM controller 54 and the SRAM 55. The CPU 52 executes, for example, command processing for processing various commands issued from the host (control unit 2), as well as the above-mentioned FTL layer processing.

These FTL layer processing and command processing may be controlled by firmware executed by the CPU 52. This firmware causes the CPU 52 to function as a write-operation control unit 61, a read-operation control unit 62, and a background-operation control unit 63.

The write-operation control unit 61 writes data designated by the write command to a usable page in a block in the NAND memory 42. The read-operation control unit 62 reads data from a page where an LBA designated by the read command is mapped. The background-operation control unit 63 includes a garbage collection control unit 64. Upon receiving a host-initiated garbage collection control command, the garbage collection control unit 64 starts a garbage collection operation (host-initiated garbage collection operation). Alternatively, the garbage collection control unit 64 may start a garbage collection operation (device-initiated garbage collection operation) when the number of free blocks in the NAND memory 42 becomes too small.

The NAND controller 53 is configured to control the NAND memory 42 under control of the CPU 52.

The DRAM controller 54 is configured to control the DRAM 43 under control of the CPU 52.

Part of the storage area of the DRAM 43 may be used as a write buffer 71 for temporarily storing data to be written to the NAND memory 42. The storage area of the DRAM 43 may be also used as a GC buffer 72 for temporarily storing data to be moved during a garbage collection (GC) operation. The storage area of the DRAM 43 may be further used for storing the above-mentioned look-up table 73.

Figure 13:
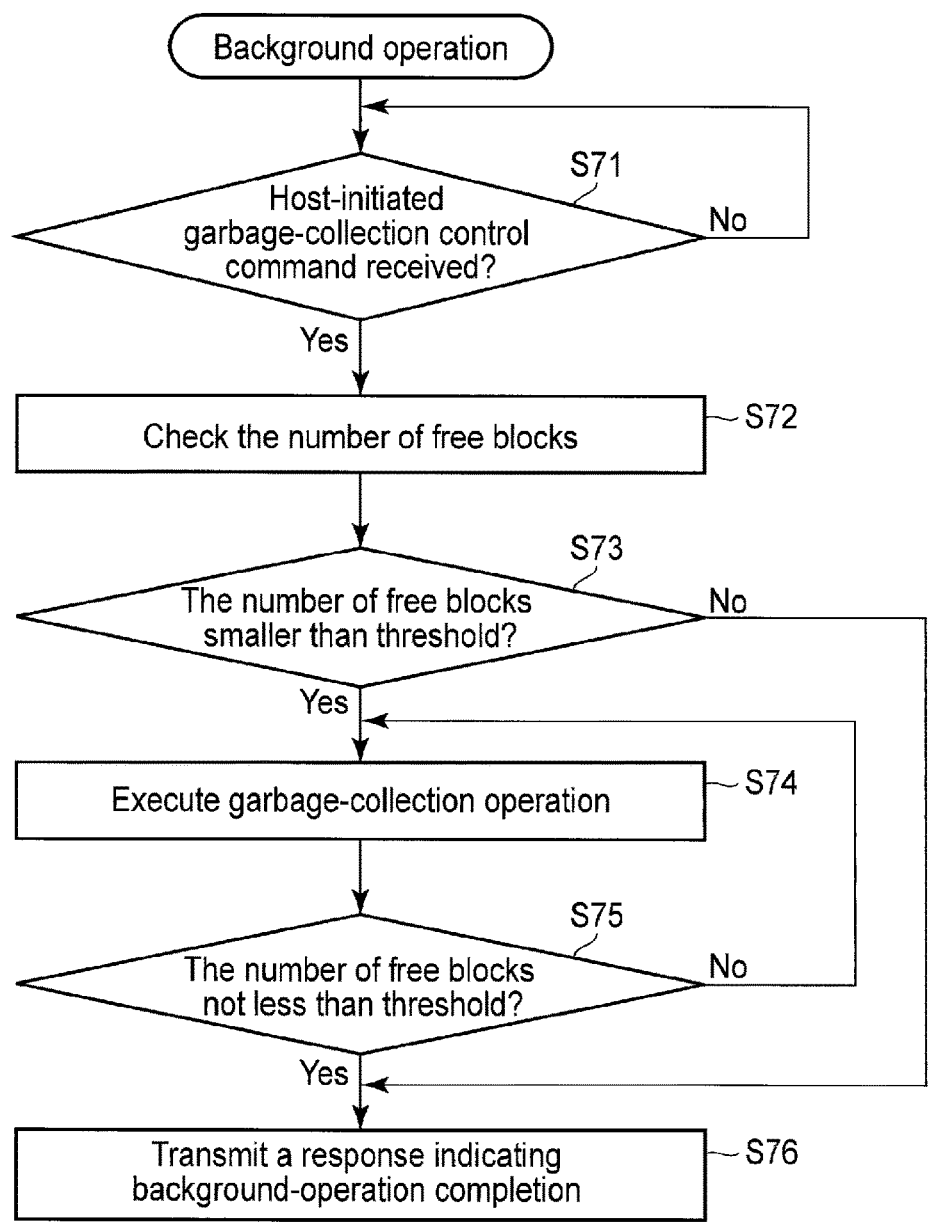
FIG. 13 is a flowchart illustrating a procedure of a background operation executed by each semiconductor storage device of FIG. 11.

The flowchart of FIG. 13 shows a procedure of the background operation performed by SSD 4 (SSD#0).

In this embodiment, a case where the background operation is a host-initiated garbage collection operation is assumed.

Upon receiving a control command (host-initiated garbage collection control command) for requesting start of a garbage collection operation (YES in step S71), the controller 41 of SSD 4 (SSD#0) checks the number of free blocks in the NAND memory 42 (step S72).

If the number of free blocks is less than a threshold (YES in step S73), the controller 41 performs a garbage collection operation to create available free blocks (step S74).

In step S74, the controller 41 selects target blocks for the garbage collection operation. For example, the controller 41 may refer to the look-up table 73, thereby selecting, from blocks including valid data, some blocks wherein the percentage of invalid data is maximum as garbage collection target blocks. The controller 41 copies all valid data in these target blocks to other blocks (free blocks), thereby converting the target blocks into free blocks that include no valid data.

If the number of free blocks increases to a value higher than a predetermined value (for example, the above-mentioned threshold) (YES in step S75), the controller 41 completes the garbage collection operation, and transmits a response indicating completion of the background operation (garbage collection operation) to the host 1 (control unit 2) (step S76).

If the number of free blocks is more than the threshold (NO in step S73), the controller 41 transmits a response indicating completion of the background operation (garbage collection operation) to the host 1 (control unit 2), without performing the garbage collection operation (step S76).

SSD 5 (SSD#1) also performs the background operation in the same procedure as described referring to FIG. 13.

FIG. 14 shows changes in the number of free blocks in each of SSD 4 (SSD#0) and SSD 5 (SSD#1).

The write data (data #1) of the write buffer 11 is written to SSD 4 (SSD#0). At this time, the number of free blocks in SSD 4 (SSD#0) may decrease. However, in the first embodiment, SSD 4 (SSD#0) performs a host-initiated garbage collection (GC) operation immediately after data #1 is written to SSD 4 (SSD#0). Thereby, the number of free blocks in SSD 4 (SSD#0) increases.

After the host-initiated garbage collection (GC) operation of SSD4 (SSD#0) is completed, the write-side SSD is switched to SSD 5 (SSD#1), and the read-side SSD is switched to SSD 4 (SSD#0).

The write data (data #1) of the write buffer 11 is written to SSD 5 (SSD#1). At this time, the number of free blocks in SSD 5 (SSD#1) may decrease. However, in the first embodiment, SSD 5 (SSD#1) performs a host-initiated garbage collection (GC) operation immediately after data #1 is written to SSD 5 (SSD#1). Thereby, the number of the free blocks of SSD 5 (SSD#1) increases.

SSD 4 (SSD#0) switched to the read-side SSD already has a sufficient number of free blocks. Therefore, SSD 4 (SSD#0) does not perform a device-initiated garbage collection (GC) operation when it is used as the read-side SSD. Accordingly, SSD 4 (SSD#0) can immediately respond to a read command.

After the host-initiated garbage collection (GC) operation of SSD 5 (SSD#1) is completed, the write-side SSD is switched to SSD 4 (SSD#0), and the read-side SSD is switched to SSD 5 (SSD#1).

If a subsequent write command is already received from the host 1, data (data #2) designated by this write command is written to SSD 4 (SSD#0). At this time, the number of free blocks in SSD 4 (SSD#0) may decrease. However, in the first embodiment, SSD 4 (SSD#0) performs a host-initiated garbage collection (GC) operation immediately after data #2 is written to SSD 4 (SSD#0). Thereby, the number of the free blocks of SSD 4 (SSD#0) again increases.

SSD 5 (SSD#1) switched to the read-side SSD already has a sufficient number of free blocks. Therefore, SSD 5 (SSD#1) does not perform a device-initiated garbage collection (GC) operation when it is used as the read-side SSD. Accordingly, SSD 5 (SSD#1) can immediately respond to a read command.

[Second Embodiment]

FIG. 15 shows the configuration of a information processing system 10 including a control unit 2 according to a second embodiment.

In FIG. 15, the storage unit 3 is controlled by the control unit 2 to operate as a storage array of a RAID configuration.

In the information processing system 10 described referring to FIGS. 1 to 14, the same data is alternately written to two SSDs, and data as a read target designated by a read command issued from the host 1 is read from the read-side SSD. In contrast, in the information processing system 10 shown in FIG. 15, when data as a read target designated by a read command issued from the host 1 is stored in an SSD that is currently executing a write operation or a background operation, the data as a read target is calculated from data and a redundancy code (parity) in other SSDs. The calculated data is transmitted to the host 1.

The storage unit (storage array) 3 includes at least three SSDs. FIG. 15 shows an example case where the storage unit (storage array) 3 includes four SSDs, namely, SSD 4 (SSD#0), SSD 5 (SSD#1), SSD 6 (SSD#2), and SSD 7 (SSD#3). The control unit 2 writes to the four SSDs, three sequential data blocks and a single redundancy code (parity) corresponding to the three data blocks. Each data block is data having a predetermined data size. Each data block is also referred to as a data unit. An SSD, to which the redundancy code (parity) is written, is switched between the four SSDs stripe by stripe. As a result, the storage unit 3 functions as an array of RAID level 5 or 6.

The control unit 2 sets one of the four SSDs as a write-side SSD, and sets the remaining three SSDs as read-side SSDs. Assume here a case where data blocks A to C and a redundancy code (parity P1) corresponding to the data blocks A to C are written to a certain stripe. Firstly, the control unit 2 sets SSD 4 (SSD#0) as the write-side SSD.

The control unit 2 may generate data blocks A to C by dividing write data (data to be written) received from the host 1.

Subsequently, the control unit 2 writes data block A to SSD 4 (SSD#0). After receiving a response indicating write completion from SSD 4 (SSD#0), the control unit 2 requests SSD 4 (SSD#0) to start a background operation. Upon receiving a response indicating completion of the background operation from SSD 4 (SSD#0), the control unit 2 switches the write-side SSD to SSD 5 (SSD#1). SSD 4 (SSD#0) is set as a read-side SSD.

The control unit 2 writes data block B to SSD 5 (SSD#1). After receiving a response indicating write completion from SSD 5 (SSD#1), the control unit 2 requests SSD 5 (SSD#1) to start a background operation. Upon receiving a response indicating completion of the background operation from SSD 5 (SSD#1), the control unit 2 switches the write-side SSD to SSD 6 (SSD#2). SSD 5 (SSD#1) is set as a read-side SSD.

The control unit 2 writes data block C to SSD 5 (SSD#2). After receiving a response indicating write completion from SSD 6 (SSD#2), the control unit 2 requests SSD 6 (SSD#2) to start a background operation. Upon receiving a response indicating completion of the background operation from SSD 6 (SSD#2), the control unit 2 switches the write-side SSD to SSD 7 (SSD#3). SSD 6 (SSD#2) is set as a read-side SSD.

The control unit 2 writes a redundancy code calculated from data blocks A to C to SSD 7 (SSD#3). After receiving a response indicating write completion from SSD 7 (SSD#3), the control unit 2 requests SSD 7 (SSD#3) to start a background operation. Upon receiving a response indicating completion of the background operation from SSD 7 (SSD#3), the control unit 2 switches the write-side SSD to SSD 4 (SSD#0). SSD 7 (SSD#3) is set as a read-side SSD.

Data blocks A to C and the redundancy code (parity P1) constitute one stripe.

Thus, a plurality of stripes each including three data blocks and one parity (parity block) are written across SSD 4 (SSD#0), SSD 5 (SSD#1), SSD 6 (SSD#2), and SSD 7 (SSD#3).

Since data is written to SSD#1 after completion of the background operation of SSD#0, a period in which SSD#0 is busy because of the write or background operation does not overlap a period in which SSD#1 is busy because of the write or background operation.

Similarly, since data is written to SSD#2 after completion of the background operation of SSD#1, a period in which SSD#1 is busy because of the write or background operation does not overlap a period in which SSD#2 is busy because of the write or background operation.

Similarly, since parity data is written to SSD#3 after completion of the background operation of SSD#2, a period in which SSD#2 is busy because of the write or background operation does not overlap a period in which SSD#3 is busy because of the write or background operation.

Therefore, while any one of SSD#0-#3 is in a busy state because of the write or background operation, the remaining three SSDs of SSD#0-#3 are maintained in a standby state in which they can respond to a read command.

When a target SSD that includes a read target data block designated by a read command from the host 1 is in a busy state because of a write or background operation, the control unit 2 reads, from the SSDs in the storage array 3 excluding the target SSD, data blocks and a redundancy code which are belonging to a stripe that corresponds to the read target data block, thereby obtaining the read target data block. After that, the control unit 2 transmits the obtained read target data block to the host 1.

In other words, when the target SSD that includes the read target data block designated by the read command from the host 1 is currently executing a write or background operation, that is, when the target SSD is the write-side SSD, the control unit 2 reads a data blocks and a redundancy code from SSDs (read-side SSDs) other than the target SSD, and calculates the content of the read target data block using the data blocks and the redundancy code.

Each read-side SSD has already executed a background operation when it is used as a write-side SSD. Because of this, each read-side SSD secures a sufficient number of free blocks, and hence does not start a background operation (device-initiated background operation). Therefore, data blocks and a redundancy code which are belonging to the same stripe as the read target data can be immediately read from the read-side SSDs, and the read target data block obtained from the data blocks and redundancy code can be transmitted to the host 1 with short latency.

The control unit 2 comprises a command queue 81, a write buffer 82, a RAID control unit 83, a write control unit 84, a read control unit 85, a read address search unit 86, a write/read command control unit 87, and a background-operation control unit 88.

The command queue 81 is a queue for holding commands received from the host 1. The write buffer 82 temporarily stores data blocks corresponding to data to be written, which is received from the host 1. The write buffer 82 may comprise a plurality of buffers (SSD0 buffer to SSD3 buffer) corresponding to SSD 4 (SSD#0) to SSD 7 (SSD#3), respectively. Each SSD buffer is used to temporarily store a data block or a redundancy code to be written to a corresponding SSD.

The RAID control unit 83 stores a plurality of data blocks to be written to SSD 4 (SSD#0) to SSD 7 (SSD#3) in the respective SSD buffers in the write buffer 82. For example, when the size of write data from the host 1 is large, the RAID control unit 83 may divide the write data into a plurality of data blocks each having a predetermined size. Further, the RAID control unit 83 calculates one redundancy code (parity) every three data blocks, and stores the parity in a corresponding SSD buffer.

The write control unit 84 writes, to SSD 4 (SSD#0) to SSD 7 (SSD#3), three data blocks and one parity stored in SSD0 buffer to SSD#3 buffer.

For instance, when data blocks A to C and parity P1 should be written, the write control unit 84 firstly transmits, to SSD 4 (SSD#0), a write command for requesting write of data block A stored in the SSD0 buffer.

After the write operation and background operation of SSD 4 (SSD#0) are completed, the write control unit 84 transmits, to SSD 5 (SSD#1), a write command for requesting write of write data block B stored in the SSD1 buffer.

After the write operation and background operation of SSD 5 (SSD#1) are completed, the write control unit 84 transmits, to SSD 6 (SSD#2), a write command for requesting write of write data block C stored in the SSD2 buffer.

After the write operation and background operation of SSD 6 (SSD#2) are completed, the write control unit 84 transmits, to SSD 7 (SSD#3), a write command for requesting write of parity P1 stored in the SSD3 buffer.

When a read control unit 95 has received a read command from the host 1, the read control unit 85 performs processing of reading newest data, designated by the read command, from the write buffer 82 or an SSD (SSD 4 to SSD 7).

The read address search unit 86 determines whether data (data block) designated by a read command from the host 1 resides in the write buffer 82.

The write/read command control unit 87 sets one of the four SSDs as a write-side SSD, and sets the remaining three SSDs as read-side SSDs.

The background-operation control unit 88 controls the background operations of SSD 4 (SSD#0) to SSD 7 (SSD#3). More specifically, upon receiving a response indicating write completion from a certain SSD, the background-operation control unit 88 transmits, to the SSD, a control command (background operation control command) for requesting start of a background operation.

FIG. 16 shows processing of reading data from the write buffer 82.

The control unit 2 inputs a read command, issued from the host 1, into the command queue 81. The control unit 2 compares an address designated by the read command with the address of each data block stored in the write buffer 82, using the read address search unit 86. If the address designated by the read command coincides with the address of the certain data block in the write buffer 82, the control unit 2 reads this data block (i.e., newest data corresponding to the address designated by the read command) from the write buffer 82, and transmits the same to the host 1.

Figure 17:
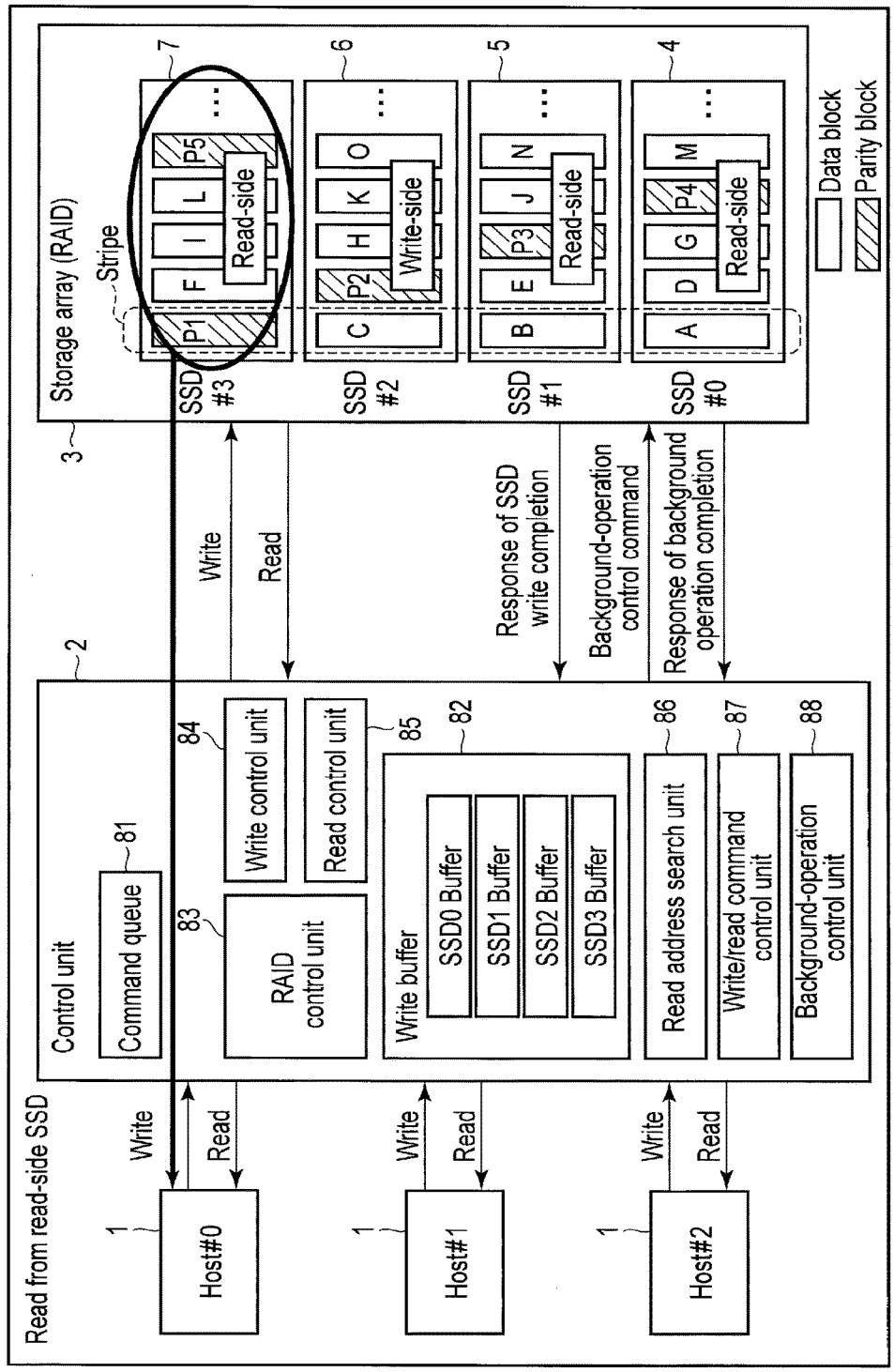
FIG. 17 is a view for explaining processing of reading data from a read-side semiconductor storage device by the control unit of the embodiment.

FIG. 17 shows processing, performed by the control unit 2, of reading data from a read-side SSD.

The control unit 2 inputs a read command, issued from the host 1, into the command queue 81. The control unit 2 compares an address designated by the read command with the address of each data block stored in the write buffer 82, using the read address search unit 86. If the address designated by the read command does not coincide with the address of any one of the data blocks in the write buffer 82, the control unit 2 reads data from the storage unit (storage array) 3.

In this case, if a read target SSD storing data corresponding to the address designated by the read command is currently set as the read-side SSD, the control unit 2 reads this data from the read target SSD. The control unit 2 transmits, to the host 1, the data read from the read target SSD.

Figure 18:
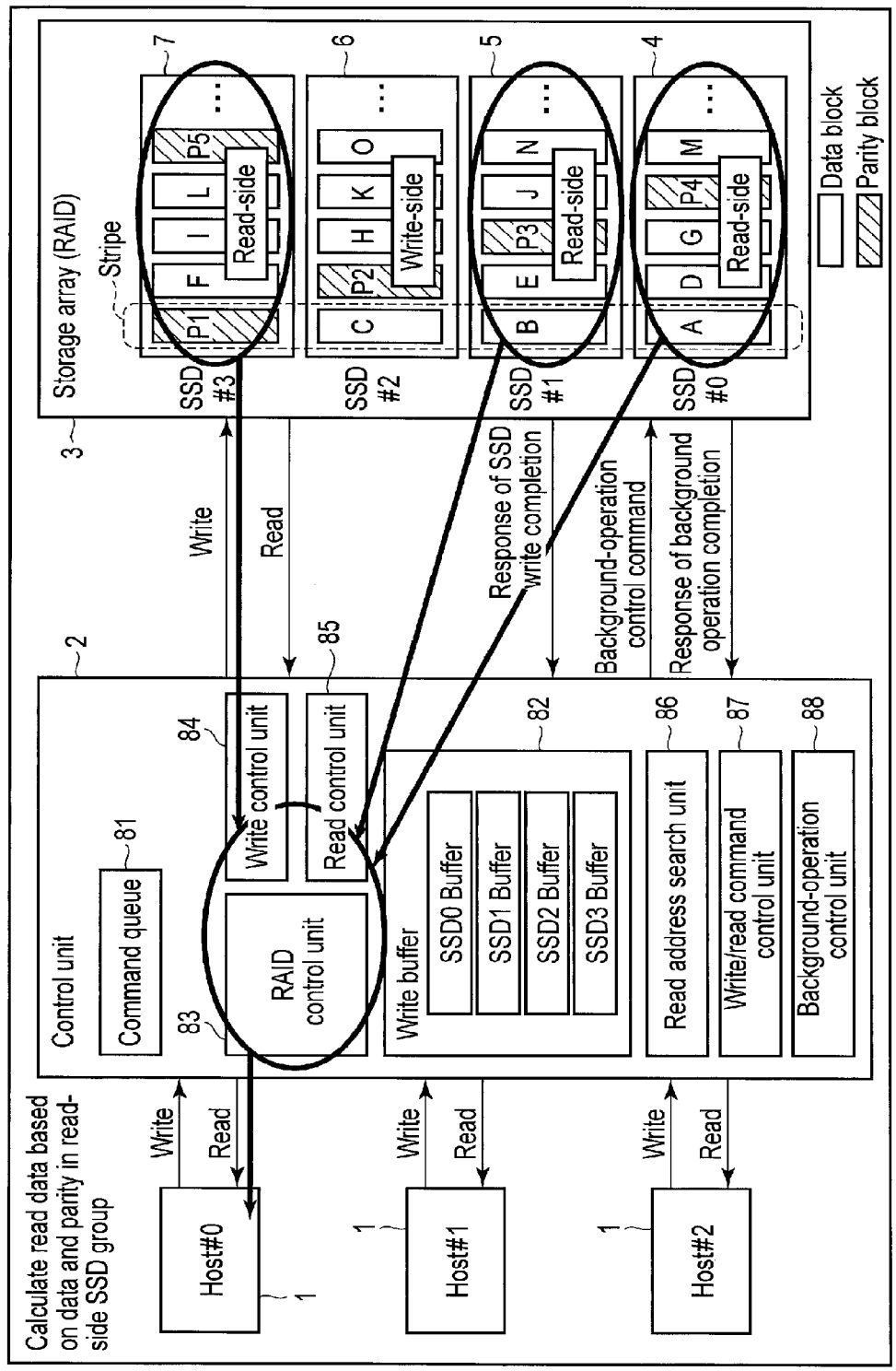
FIG. 18 is a view for explaining processing, executed by the control unit of the embodiment, of calculating read data based on data and redundancy codes (parity) in read-side semiconductor storage devices.

FIG. 18 shows processing, performed by the control unit 2, of generating (calculating) read target data from the data blocks and redundancy code of a read-side SSDs.

The control unit 2 inputs a read command, issued from the host 1, into the command queue 81. The control unit 2 compares an address designated by the read command with the address of each data block stored in the write buffer 82, using the read address search unit 86. If the address designated by the read command does not coincide with the address of any one of the data blocks in the write buffer 82, the control unit 2 performs a read access for the storage unit (storage array) 3.

In this case, if a read target SSD storing a data block corresponding to the address designated by the read command is currently set as the write-side SSD, the control unit 2 reads data blocks and parity which are belonging to a stripe corresponding to the above-mentioned data block, from the remaining SSDs in the storage unit (storage array) 3 excluding the above-mentioned read target SSD. The control unit 2 obtains data (data block) corresponding to the address designated by the read command, from the read data blocks and parity. The control unit 2 transmits the obtained data to the host 1.

Figure 19:
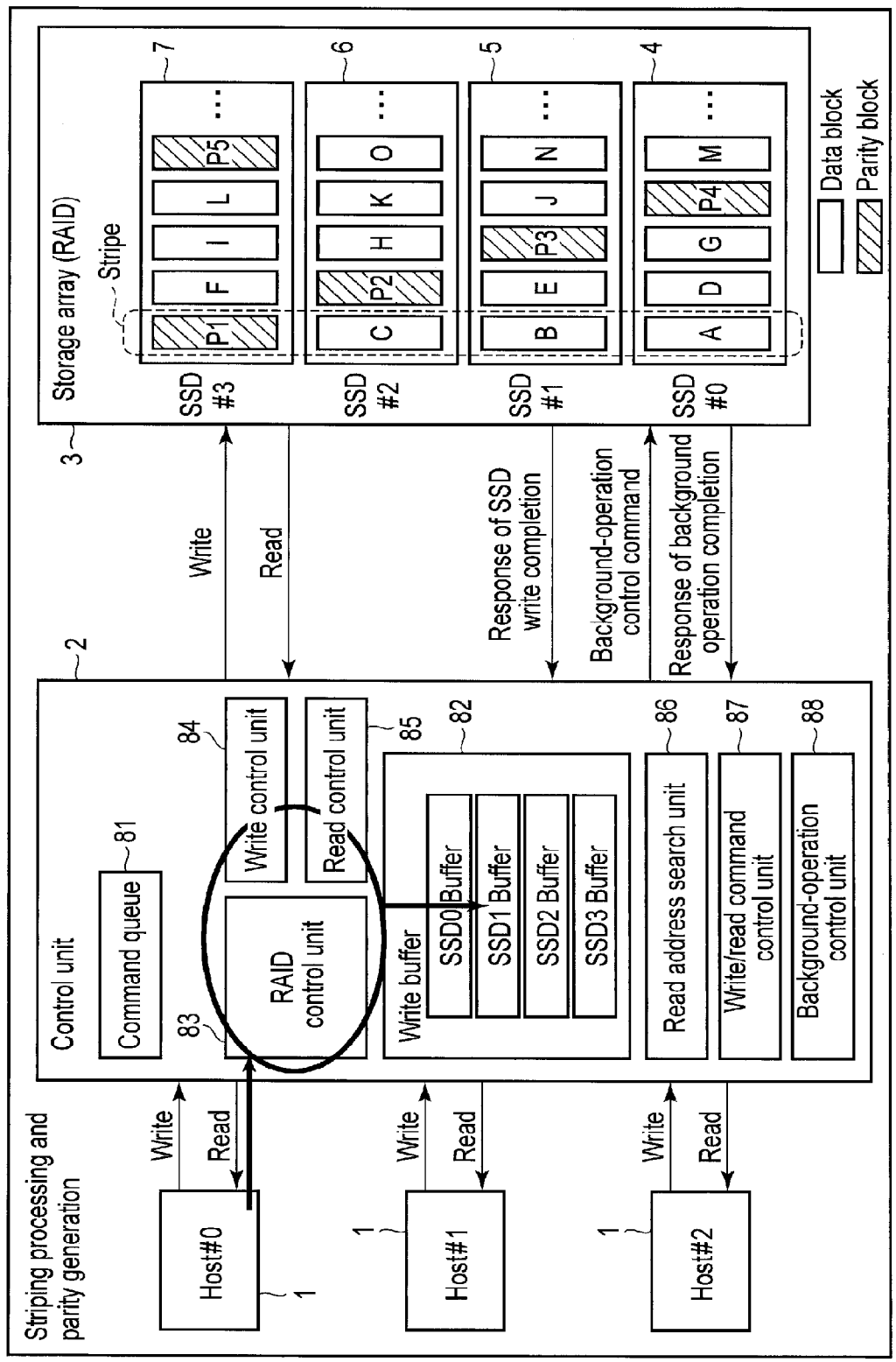
FIG. 19 is a view for explaining striping processing and parity generation processing executed by the control unit of the embodiment.

FIG. 19 shows striping processing and parity-generation processing performed by the control unit 2.

The control unit 2 inputs a write command, issued from the host 1, into the command queue 81. The RAID control unit 83 of the control unit 2 obtains a plurality of data blocks by, for example, dividing write data, received from the host 1, into portions of a predetermined size. The RAID control unit 83 stores in SSD buffers of the write buffer 82 these data blocks. Further, the RAID control unit 83 generates parity data from these data blocks, and stores it in the remaining SSD buffer in the write buffer 82.

FIG. 20 shows data update processing performed by the control unit 2.

Assume here the case where only one data block in a stripe is updated by a write command.

The control unit 2 inputs a write command, issued from the host 1, into the command queue 81. The control unit 2 reads data before update and parity before update from a read-side SSDs. The RAID control unit 83 of the control unit 2 creates updated parity based on updated data, data before update and parity before update. Further, the RAID control unit 83 stores updated data and updated parity in the write buffer 82.

Figure 21:
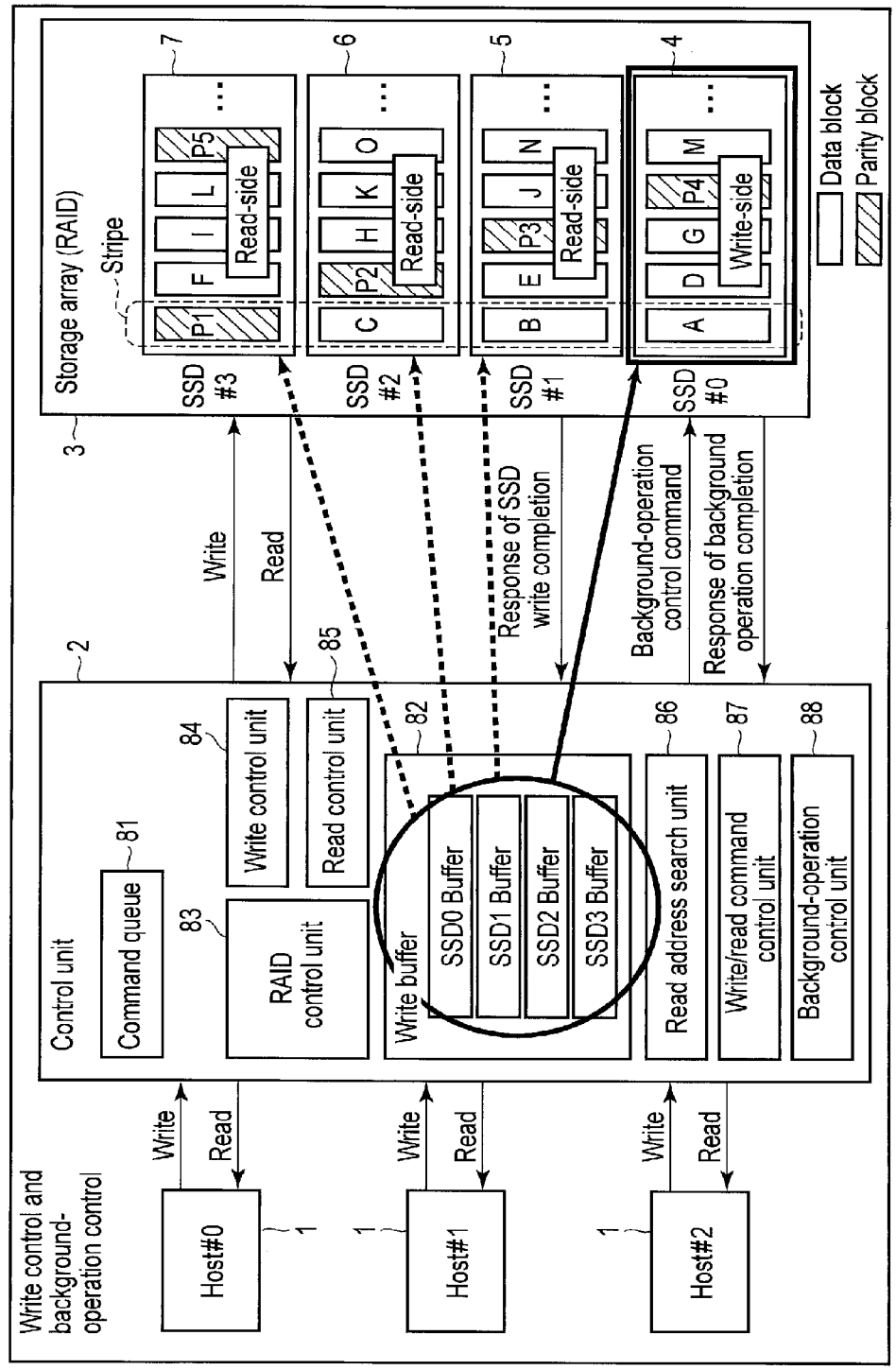
FIG. 21 is a view for explaining write control and background control executed by the control unit of the embodiment.

FIG. 21 shows write control and background control performed by the control unit 2.

The control unit 2 sequentially writes data blocks and parity to a plurality of SSDs in the storage unit (storage array) 3. Specifically, the control unit 2 performs the following operations:

(1) The control unit 2 sets SSD#0 as a write-side SSD, and sets SSD#1, SSD#2 and SSD#3 as read-side SSDs.

(2) The control unit 2 transmits a write command to SSD#0, and writes data (data block) to SSD#0.

(3) Upon receiving a response indicating write completion from SSD#0, the control unit 2 transmits a background control command to SSD#0, thereby requesting SSD#0 to start a background operation.

(4) Upon receiving a response indicating background-operation completion from SSD#0, the control unit 2 sets SSD#1 as the write-side SSD, and sets the other SSDs, i.e., SSD#0, SSD#2 and SSD#3 as the read-side SSDs.

(5) The control unit 2 transmits a write command to SSD#1, and writes data (data block) to SSD#1.

(6) Upon receiving a response indicating write completion from SSD#1, the control unit 2 transmits a background control command to SSD#1, thereby requesting SSD#1 to start a background operation.

(7) Upon receiving a response indicating background-operation completion from SSD#1, the control unit 2 sets SSD#2 as the write-side SSD, and sets the other SSDs, i.e., SSD#0, SSD#1 and SSD#3 as the read-side SSDs.

(8) The control unit 2 transmits a write command to SSD#2, and writes the data (data block) to SSD#2.

(9) Upon receiving a response indicating write completion from SSD#2, the control unit 2 transmits a background control command to SSD#2, thereby requesting SSD#2 to start a background operation.

(10) Upon receiving a response indicating background-operation completion from SSD#2, the control unit 2 sets SSD#3 as the write-side SSD, and sets the other SSDs, i.e., SSD#0, SSD#1 and SSD#2 as the read-side SSDs.

(11) The control unit 2 transmits a write command to SSD#3, and writes parity (parity block) to SSD#3.

(12) Upon receiving a response indicating write completion from SSD#3, the control unit 2 transmits a background control command to SSD#3, thereby requesting SSD#3 to start a background operation.

(13) Upon receiving a response indicating background-operation completion from SSD#3, the control unit 2 sets SSD#0 as the write-side SSD, and sets the other SSDs, i.e., SSD#1, SSD#2 and SSD#3 as the read-side SSDs.

Figure 22:
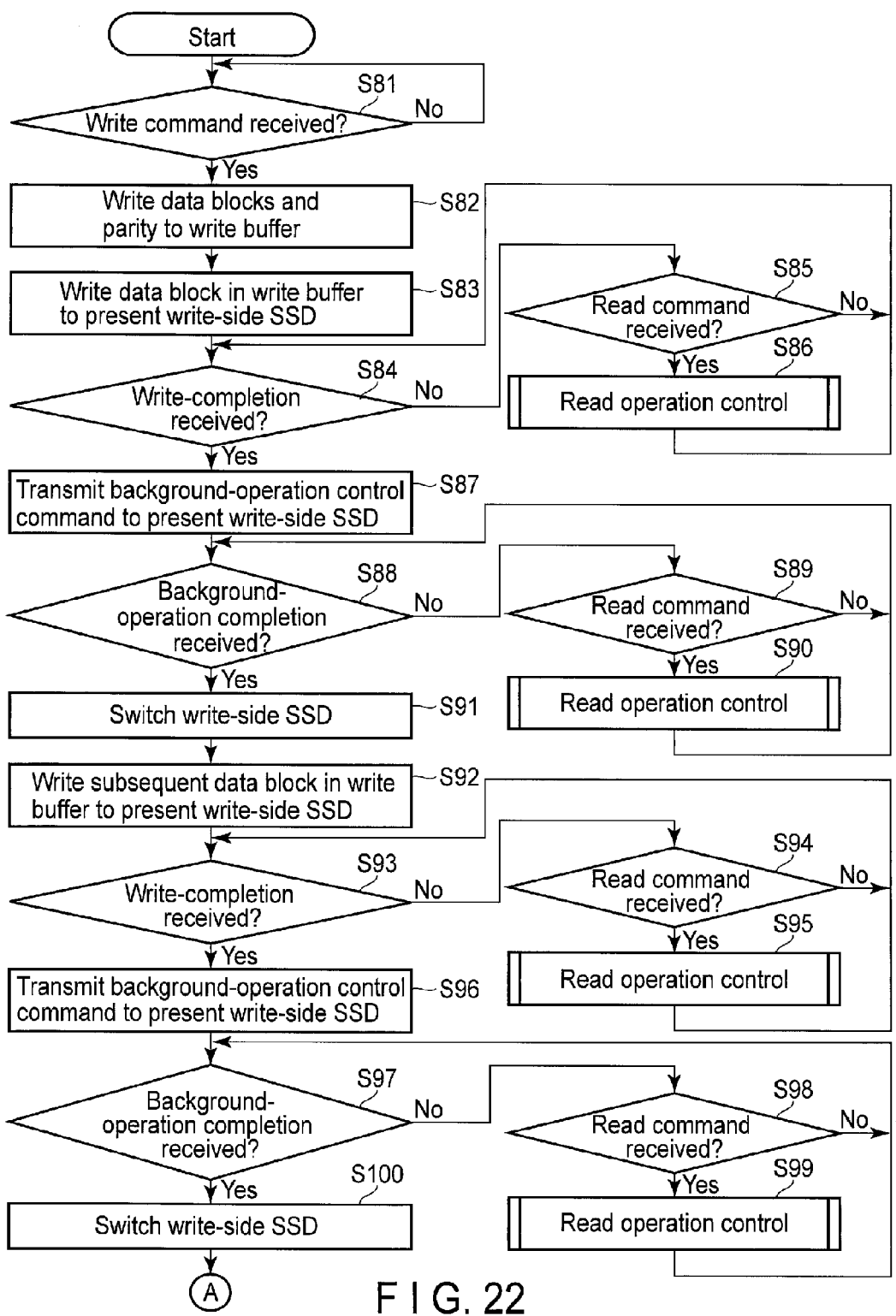
FIG. 22 is a flowchart illustrating part of a procedure of a series of processing executed by the control unit of the embodiment.

The flowchart of FIG. 22 shows a procedure of a series of processing performed by the control unit 2. Assume here the case where a RAID including three SSDs is controlled.

Upon receiving a write command from the host 1 (YES in step S81), the control unit 2 writes, to the write buffer 82, data blocks to be written which are received from the host 1, and parity calculated from these data blocks (step S82). The control unit 2 transmits, to the present write-side SSD, a write command for requesting write of a first data block in the write buffer 82 (step S83). The control unit 2 waits for a response indicating write completion and issued from the present write-side SSD (step S84). If a read command from the host 1 is received while waiting for the response indicating the write completion (YES in step S85), the control unit 2 performs read operation control, which will be described in detail referring to FIG. 24 (step S86).

Upon receiving the response indicating the write completion from the present write-side SSD (YES in step S84), the control unit 2 transmits, to the present write-side SSD, a background control command for requesting start of a background operation (step S87). The control unit 2 waits for a response indicating completion of the background operation and issued from the present write-side SSD (step S88). If a read command from the host 1 is received while waiting for the response indicating completion of the background operation (YES in step S89), the control unit 2 performs read operation control (step S90).

Upon receiving, from the present write-side SSD, the response indicating completion of the background operation (YES in step S88), the control unit 2 switches the present write-side SSD to a subsequent SSD (step S91).

The control unit 2 transmits, to the present write-side SSD, a write command for requesting write of a subsequent data block in the write buffer 82 (step S92). The control unit 2 waits for a response indicating write completion and issued from the present write-side SSD (step S93). If a read command from the host 1 is received while waiting for the response indicating the write completion (YES in step S94), the control unit 2 performs read operation control (step S95).

Upon receiving the response indicating the write completion from the present write-side SSD (YES in step S93), the control unit 2 transmits, to the present write-side SSD, a background control command for requesting start of a background operation (step S96). The control unit 2 waits for a response indicating completion of the background operation and issued from the present write-side SSD (step S97). If a read command from the host 1 is received while waiting for the response indicating background-operation completion (YES in step S98), the control unit 2 performs read operation control (step S99).

Upon receiving, from the present write-side SSD, the response indicating background-operation completion (YES in step S97), the control unit 2 switches the present write-side SSD to a subsequent SSD (step S100).

As shown in FIG. 23, the control unit 2 transmits, to the present write-side SSD, a write command for requesting write of parity (parity data) in the write buffer 82 (step S101). The control unit 2 waits for a response indicating write completion and issued from the present write-side SSD (step S102). If a read command from the host 1 is received while waiting for the response indicating write completion (YES in step S103), the control unit 2 performs read operation control (step S104).

Upon receiving the response indicating write completion from the present write-side SSD (YES in step S102), the control unit 2 transmits, to the present write-side SSD, a background control command for requesting start of a background operation (step S105). The control unit 2 waits for a response indicating background-operation completion and issued from the present write-side SSD (step S106). If a read command from the host 1 is received while waiting for the response indicating write completion (YES in step S107), the control unit 2 performs read operation control (step S108).

Upon receiving, from the present write-side SSD, the response indicating background-operation completion (YES in step S106), the control unit 2 switches the present write-side SSD to a subsequent SSD (step S109).

Figure 24:
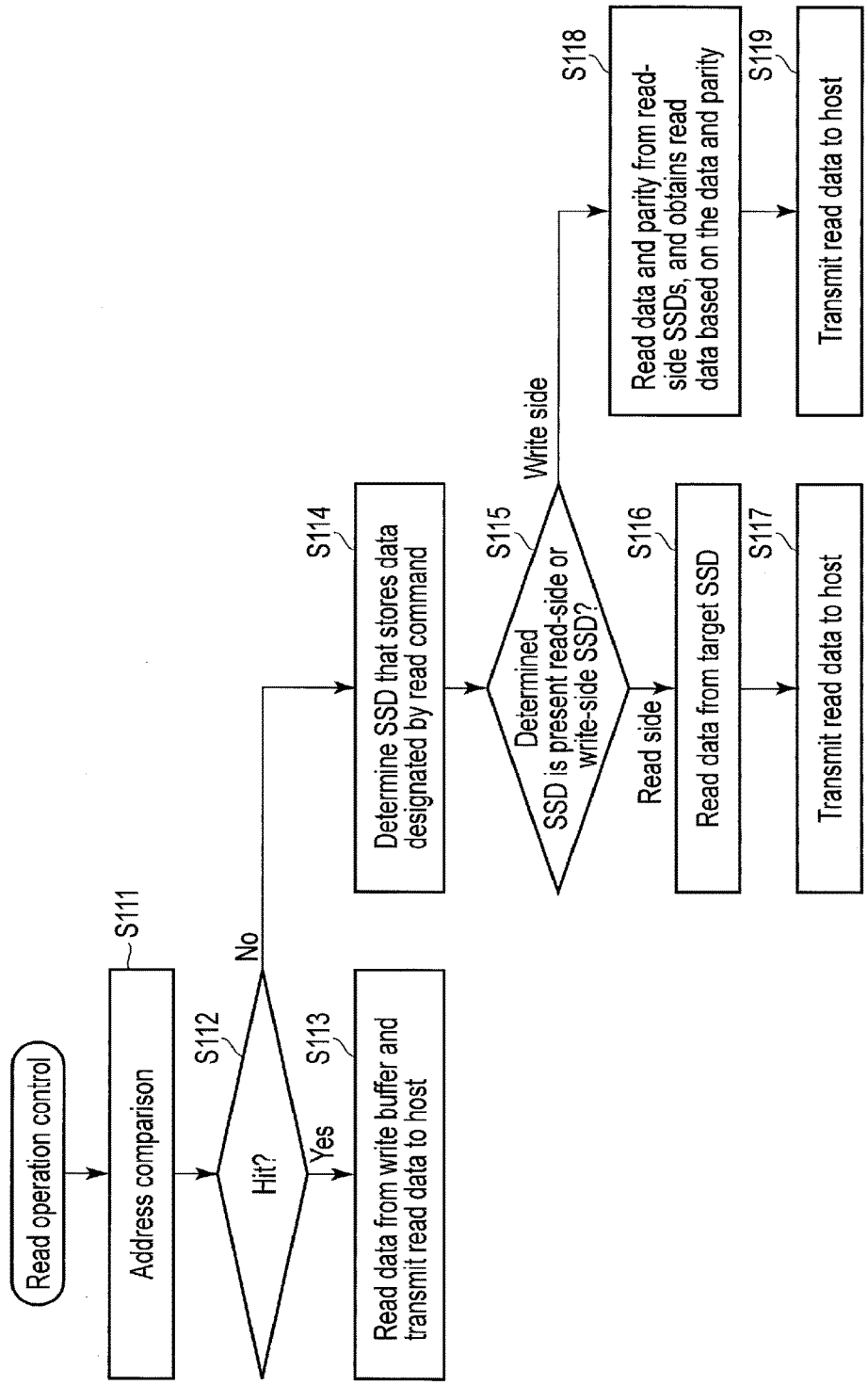
FIG. 24 is a flowchart illustrating a procedure of read-operation control executed by the control unit of the embodiment.

The flowchart of FIG. 24 shows read operation control performed by the control unit 2.

Upon receiving a read command from the host 1, the control unit 2 performs the following processing:

First, the control unit 2 compares an address designated by the read command with the address of each data block stored in the write buffer 82 (step S111), and determines whether a data block having an address identical to the address designated by the read command resides in the write buffer 82 (step S112).

If a data block (read target data) having an address identical to the address designated by the read command resides in the write buffer 82 (YES in step S112), the control unit 2 reads this data from the write buffer 82 and transmits it to the host 1 (step S113).

In contrast, if a data block having an address identical to the address designated by the read command does not reside in the write buffer 82 (NO in step S112), the control unit 2 determines an SSD that stores a data block (read target data) designated by the read command (step S114).

The control unit 2 determines whether the determined SSD is set as the read-side SSD or the write-side SSD (step S115).

If the determined SSD is the read-side SSD, the control unit 2 transmits a read command to this SSD, thereby reading read target data therefrom (step S116), and transmits the read data to the host 1 (step S117).

In contrast, if the determined SSD is the write-side SSD, the control unit 2 transmits a read command to each SSD of the read-side SSDs. Thus, the control unit 2 reads data blocks and parity from the read-side SSDs, and obtains data, designated by the read command, from the data blocks and parity (step S118). After that, the control unit 2 transmits the obtained data to the host 1 (step S119).

Figure 25:
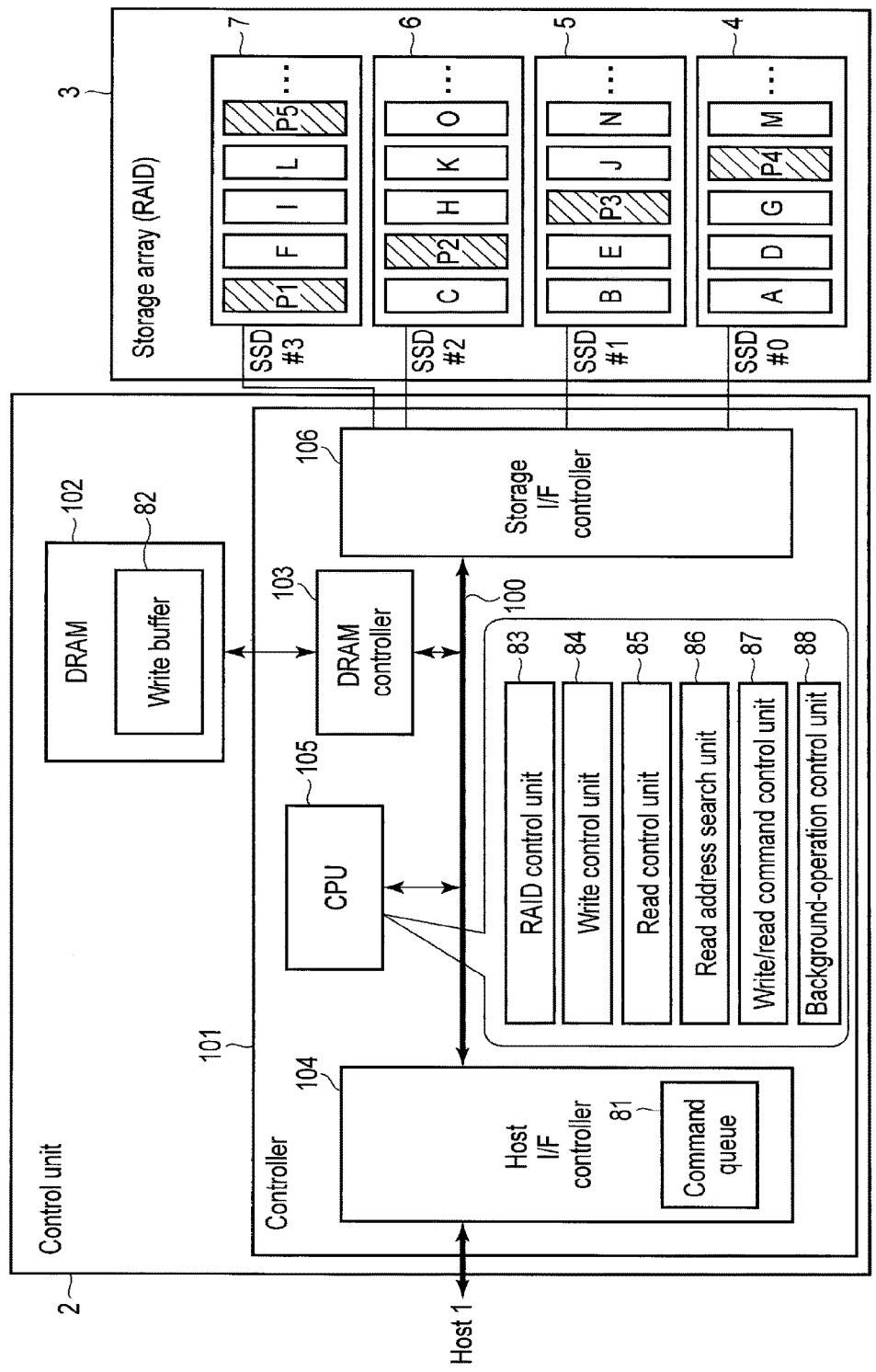
FIG. 25 is another block diagram illustrating a hardware configuration example of the control unit of the embodiment.

FIG. 25 shows a hardware configuration example of the control unit 2 configured to control the storage array 3.

The control unit 2 may comprise a controller (control circuit) 101, and a RAM, such as the DRAM 102. Part of the storage area of the DRAM 102 may be used as the above-mentioned write buffer 82.

The controller 101 comprises a host interface controller 104, a CPU 105, a DRAM controller 103, a storage interface controller 106, etc. The host interface controller 104, the CPU 105, the DRAM controller 103 and the storage interface controller 106 are interconnected through a bus 100.

The host interface controller 81 is configured to interface with the host 1. The host interface controller 81 receives various commands, such as write commands and read commands, from the host 1.

The CPU 105 is a processor configured to control the host interface controller 104, the DRAM controller 103 and the storage interface controller 106. The CPU 105 controls a write buffer 102 and SSD 4 to 7. Firmware executed by the CPU 105 causes the CPU 105 to serve as the above-described RAID control unit 83, the write control unit 84, the read control unit 85, the read address search unit 86, the write/read command control unit 87 and the background-operation control unit 88.

The storage interface controller 106 transmits a command, issued from the CPU 105, to one of SSDs 4 to 7 under control of the CPU 105.

Each of SSDs 4 to 7 has a hardware configuration similar to that shown in FIG. 11.

Each of SSDs 4 to 7 performs a background operation including a host-initiated garbage collection operation. The procedure of the background operation performed by each of SSDs 4 to 7 is similar to that described referring to the flowchart of FIG. 13.

The number of free blocks in each of SSDs 4 to 7 may decrease during a write operation, as described referring to FIG. 14. However, it is increased by a background operation performed immediately after the write operation. Therefore, any SSD set as the read-side SSD already has a sufficient number of free blocks. Accordingly, no read-side SSD performs a device-initiated garbage collection (GC) operation. This means that each read-side SSD can immediately respond to a read command.

As described above, in the embodiment, regardless of whether the control unit 2 has a configuration as shown in FIG. 1 or 15, data requested to be read by a read command output from the host 1 can be read only using one or more read-side SSDs. Furthermore, in any read-side SSD, a background operation is already performed in a period immediately before a certain SSD is set as a new read-side SSD, that is, during a period in which the certain SSD is used as a write-side SSD. Because of this, a sufficient number of free blocks are secured in any read-side SSD, whereby start of a background operation (for example, a device-initiated background operation) by any read-side SSD can be suppressed. Therefore, data designated by a read command can be immediately read from a present read-side SSD and transmitted to the host 1. As a result, read latency can be stabilized.

Furthermore, in the configuration of FIG. 15, data requested by the host 1 can be quickly provided to the host 1, using read-side SSDs that is included in the same number of SSDs as required in a normal RAID configuration. This enables high reliability due to the RAID and stable read latency to be simultaneously, easily realized.

The embodiment employs a NAND memory as an example of a nonvolatile memory. However, the function of the embodiment is also applicable to, for example, a three-dimensional flash memory, or various nonvolatile memories, such as a magnetoresistive random access memory (MRAM), a phase-change random access memory (PRAM), a resistive random access memory (ReRAM) and a ferroelectric random access memory (FeRAM).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A control unit connectable to first to third semiconductor storage devices which include respective nonvolatile memories, the control unit comprising:
    a write buffer configured to temporarily store data blocks to be written, which are received from a host; and
    a controller configured to:
    write, to the first semiconductor storage device, a first data block included in the data blocks;
    request the first semiconductor storage device to start a background operation, after receiving a response indicating write completion from the first semiconductor storage device;
    write, to the second semiconductor storage device, a second data block included in the data blocks, after the first semiconductor storage device completes the background operation;
    request the second semiconductor storage device to start a background operation, after receiving a response indicating write completion from the second semiconductor storage device;
    write, to the third semiconductor storage device, a redundancy code calculated from the first and second data blocks, after the first semiconductor storage device completes the background operation;
    request the third semiconductor storage device to start a background operation, after receiving a response indicating write completion from the third semiconductor storage device;
    read the second data block from the second semiconductor storage device, read the redundancy code from the third semiconductor storage device, and generate the first data block using the read second data block and the read redundancy code, when data designated by a read command received from the host is included in the first data block, and the first semiconductor storage device is in a busy state due to the write operation or the background operation; and
    transmit the generated first data block to the host,
    wherein the first data block, the second data block and the redundancy code form one stripe.

2. The control unit of claim 1, wherein the controller is further configured to switch a semiconductor storage device, to which the redundancy code is to be written, among the first semiconductor storage device, the second semiconductor storage device, and the third semiconductor storage device.

3. The control unit of claim 1, wherein
    a period in which the second semiconductor device is in a busy state because of the write operation or the background operation does not overlap a period in which the first semiconductor device is in the busy state because of the write operation or the background operation; and
    a period in which the third semiconductor device is in a busy state because of the write operation or the background operation does not overlap the period in which the second semiconductor device is in the busy state because of the write operation or the background operation.

4. The control unit of claim 1, wherein during a period in which the first semiconductor device is in the busy state because of the write operation or the background operation, the controller sets the second and third semiconductor storage devices in a standby state in which the second and third semiconductor storage devices are prepared to respond to the read command.

5. The control unit of claim 1, wherein the background operation includes a garbage collection operation.

6. The control unit of claim 1, wherein when start of the background operation is requested, each of the first, second and third semiconductor storage devices performs a garbage collection operation.

7. The control unit of claim 6, wherein
    when the start of the background operation is requested, each of the first, second and third semiconductor storage devices determines whether the number of free blocks is not less than a threshold;
    when the number of the free blocks is not less than the threshold, each of the first, second and third semiconductor storage devices transmits, to the control unit, a response indicating completion of the background operation, without performing the garbage collection operation; and
    when the number of the free blocks is less than the threshold, each of the first, second and third semiconductor storage devices performs the garbage collection operation.

8. The control unit of claim 1, wherein
    the first, second and third semiconductor storage devices further include respective device controllers;
    a respective one of the device controllers is configured to:
    control a corresponding one of the nonvolatile memories;
    determine whether the number of free blocks included in the corresponding one of the nonvolatile memories is not less than a threshold, when start of the background operation is requested; and transmit, to the control unit, a response indicating completion of the background operation, without performing a garbage collection operation on the corresponding one of the nonvolatile memories, when the number of the free blocks included in the corresponding one of the nonvolatile memories is not less than the threshold.

9. A method of controlling first to third semiconductor storage devices which include respective nonvolatile memories, the method comprising:

temporarily storing, in a write buffer, data blocks to be written, which are received from a host;

writing, to the first semiconductor storage device, a first data block included in the data blocks;

requesting the first semiconductor storage device to start a background operation, after receiving a response indicating write completion from the first semiconductor storage device;

writing, to the second semiconductor storage device, a second data block included in the data blocks, after the first semiconductor storage device completes the background operation;

requesting the second semiconductor storage device to start a background operation, after receiving a response indicating write completion from the second semiconductor storage device;

writing, to the third semiconductor storage device, a redundancy code calculated from the first and second data blocks, after the second semiconductor storage device completes the background operation;

requesting the third semiconductor storage device to start a background operation, after receiving a response indicating write completion from the third semiconductor storage device, the first and second data blocks and the redundancy code forming one stripe; and reading the second data block from the second semiconductor storage device, reading the redundancy code from the third semiconductor storage device, generating the first data block using the read second data block and the read redundancy code, and transmitting the generated first data block to the host, when data designated by a read command from the host is included in the first data block, and the first semiconductor device is in a busy state because of the write operation or the background operation.

10. The method of claim 9, wherein
a period in which the second semiconductor device is in a busy state because of the write operation or the background operation does not overlap a period in which the first semiconductor device is in the busy state because of the write operation or the background operation; and a period in which the third semiconductor device is in a busy state because of the write operation or the background operation does not overlap the period in which the second semiconductor device is in the busy state because of the write operation or the background operation.

11. The method of claim 9, wherein the background operation includes a garbage collection operation.

12. The method of claim 9, wherein when start of the background operation is requested, each of the first, second and third semiconductor storage devices performs a garbage collection operation.

13. The method of claim 12, wherein
when the start of the background operation is requested, each of the first, second and third semiconductor storage devices determines whether the number of free blocks is not less than a threshold;

when the number of the free blocks is not less than the threshold, each of the first, second and third semiconductor storage devices transmits a response indicating completion of the background operation, without performing the garbage collection operation; and when the number of the free blocks is less than the threshold, each of the first, second and third semiconductor storage devices performs the garbage collection operation.

* * * * *